US012720800B2

(12) United States Patent
Park et al.

(10) Patent No.: US 12,720,800 B2
(45) Date of Patent: Aug. 25, 2026

(54) SEMICONDUCTOR DEVICE HAVING A TWO-DIMENSIONAL CHANNEL AND METHOD FOR FABRICATING THE SAME

(71) Applicant: SAMSUNG ELECTRONICS CO., LTD., Suwon-si (KR)

(72) Inventors: Sung Il Park, Suwon-si (KR); Jae Hyun Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 911 days.

(21) Appl. No.: 17/933,797

(22) Filed: Sep. 20, 2022

(65) Prior Publication Data

US 2023/0261064 A1 Aug. 17, 2023

(30) Foreign Application Priority Data

Feb. 15, 2022 (KR) ........................ 10-2022-0019276

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/031* (2025.01);
(Continued)

(58) Field of Classification Search
CPC .. H10D 30/67; H10D 30/6729; H10D 30/031; H10D 30/6735; H10D 62/151;
(Continued)

(56) References Cited

U.S. PATENT DOCUMENTS 8,692,229 B2 4/2014 Cohen et al.
9,559,168 B2 1/2017 Lai et al.
(Continued)

FOREIGN PATENT DOCUMENTS

EP 4 156 246 3/2023

OTHER PUBLICATIONS

Pin-Chun Shen, et al., "Ultralow Contact Resistance Between Semimetal and Monolayer Semiconductors," Nature, Nature Publishing Group UK, London, vol. 593, No. 7858, May 12, 2021 (May 12, 2021), pp. 211-217, XP037450461.
(Continued)

*Primary Examiner* — Wasiul Haider
(74) *Attorney, Agent, or Firm* — MORGAN, LEWIS & BOCKIUS LLP

(57) ABSTRACT

There is provided a semiconductor device having reduced contact resistance and enhanced performance. The semiconductor device includes a substrate, a first active pattern spaced apart from the substrate and extending in a first direction, and including a first two-dimensional semiconductor material, a first gate electrode extending in a second direction intersecting the first direction on the substrate, and through which the first active pattern penetrates, and a first source/drain contact which includes a first contact insertion film and a first filling metal film sequentially stacked on a side surface of the first gate electrode, and is connected to the first active pattern, wherein the first contact insertion film at least partially surrounds a lower surface, a side surface and an upper surface of an end portion of the first active pattern, and the first active pattern and the first contact insertion film form an ohmic contact.

18 Claims, 24 Drawing Sheets

(51) Int. Cl.

*H10D 30/43* (2025.01)
*H10D 64/01* (2025.01)
*H10D 86/00* (2025.01)
*H10D 86/01* (2025.01)
*H10D 62/10* (2025.01)

(52) U.S. Cl.

CPC ......... *H10D 30/43* (2025.01); *H10D 30/6735* (2025.01); *H10D 64/01* (2025.01); *H10D 86/01* (2025.01); *H10D 86/201* (2025.01); *H10D 30/6736* (2025.01); *H10D 62/118* (2025.01)

(58) Field of Classification Search

CPC .... H10D 64/251; H10D 88/00; H10D 30/501; H10D 30/502; H10D 30/6758; H10D 30/6757; H10D 30/6731; H10D 30/6732; H10D 62/118; H10D 62/121; H10D 64/62; H10D 30/014; H10D 30/43; H10D 86/201; H10D 30/6736; H10D 30/47; H10D 62/80; H10D 84/0177; H10D 84/02; H10D 84/038; H10D 84/85; H10D 99/00; H10D 30/62; H10D 84/834; H10D 84/856; B82Y 10/00

See application file for complete search history.

(56) References Cited

U.S. PATENT DOCUMENTS

| | | | | |
|---|---|---|---|---|
| 10,541,132 | B2 | 1/2020 | Lin et al. | |
| 10,741,646 | B2 | 8/2020 | Yeh et al. | |
| 10,872,973 | B2 | 12/2020 | Lin et al. | |
| 10,879,469 | B1 | 12/2020 | Vasen | |
| 11,164,809 | B2 | 11/2021 | Naylor et al. | |
| 2018/0145184 | A1 | 5/2018 | Clifton et al. | |
| 2020/0235092 | A1 | 7/2020 | Likak et al. | |
| 2020/0235098 | A1 | 7/2020 | Li et al. | |
| 2020/0295127 | A1 | 9/2020 | Mannebach et al. | |
| 2021/0408227 | A1* | 12/2021 | O'Brien ................. | H10D 30/47 |
| 2023/0113614 | A1* | 4/2023 | O'Brien ............... | H10D 86/421 257/288 |

OTHER PUBLICATIONS

Das Saptarshi et al., "Transistors Based On Two-Dimensional Materials for Future Integrated Circuits," Nature Electronics, vol. 4, No. 11, Nov. 1, 2021 (Nov. 1, 2021), pp. 786-799, XP093035594.

Zheng Yue et al., "OHMIC Contact Engineering for Two-Dimensional Materials," Cell Reports Physical Science, vol. 2, No. 1, Jan. 1, 2021 (Jan. 1, 2021), p. 100298, XP093056030.

* cited by examiner

SEMICONDUCTOR DEVICE HAVING A TWO-DIMENSIONAL CHANNEL AND METHOD FOR FABRICATING THE SAME

CROSS-REFERENCE TO RELATED APPLICATION

This application claims priority under 35 U.S.C. § 119 to Korean Patent Application No. 10-2022-0019276 filed on Feb. 15, 2022 in the Korean Intellectual Property Office, the contents are herein incorporated by reference in its entirety.

TECHNICAL FIELD

The present disclosure relates to a semiconductor device and, more specifically, to a semiconductor device that uses a two-dimensional semiconductor material as a channel, and a method for fabricating the same.

DISCUSSION OF THE RELATED ART

One approach for increasing the density of an integrated circuit device includes utilizing a multi-gate transistor in which a silicon body having a fin or nanowire shape is formed on a substrate and a gate is formed on a surface of the silicon body.

Since such a multi-gate transistor utilizes a three-dimensional channel, scaling is more easily performed. Further, even if a gate length of the multi-gate transistor is not increased, better current control capability may still be achieved. Furthermore, a SCE (short channel effect) in which potential of a channel region is influenced by a drain voltage may be effectively suppressed.

Other semiconductor devices may utilize a two-dimensional semiconductor material as a channel. In such a device, to enhance the performance of the semiconductor device, mobility may be increased, the short channel effect (SCE) may be utilized, and the like.

SUMMARY

A semiconductor device includes a substrate, a first active pattern spaced apart from the substrate and extending in a first direction, the first active pattern including a first two-dimensional semiconductor material, a first gate electrode extending in a second direction intersecting the first direction on the substrate, and through which the first active pattern penetrates, and a first source/drain contact that includes a first contact insertion film and a first filling metal film sequentially stacked on a side surface of the first gate electrode, and is connected to the first active pattern. The first contact insertion film at least partially surrounds a lower surface, a side surface and an upper surface of an end portion of the first active pattern, and the first active pattern and the first contact insertion film form an ohmic contact.

A semiconductor device includes a substrate, an active pattern spaced apart from the substrate and extending in a first direction. The active pattern including a two-dimensional semiconductor material, a gate electrode that extends in a second direction intersecting the first direction on the substrate, and through which the active pattern penetrates, a gate dielectric film interposed between the active pattern and the gate electrode, and a source/drain contact connected to the active pattern, on a side surface of the gate electrode. The active pattern includes a channel portion at least partially surrounded by the gate dielectric film, and a protruding portion protruding from a side surface of the gate dielectric film, the source/drain contact includes a contact insertion film extending along a profile of the protruding portion of the active pattern, and a filling metal film stacked on the contact insertion film. The active pattern and the contact insertion film form an ohmic contact.

A semiconductor device includes a substrate, a first sheet pattern spaced apart from the substrate and extending in a first direction. The first sheet pattern includes a transition metal dichalcogenide. A second sheet pattern is spaced apart from the substrate, farther than the first sheet pattern. The second sheet pattern extends in the first direction, and includes the transition metal chalcogenide, a gate electrode that extends in a second direction intersecting the first direction on the substrate, and through which each of the first sheet pattern and the second sheet pattern penetrates, a gate dielectric film interposed between the first sheet pattern and the gate electrode, and between the second sheet pattern and the gate electrode, a gate spacer extending along a side surface of the gate electrode, and through which each of the first sheet pattern and the second sheet pattern penetrates, and a source/drain contact that includes a contact insertion film and a filling metal film sequentially stacked on a side surface of the gate spacer. The source/drain contact is connected to the first sheet pattern and the second sheet pattern. Each of the first sheet pattern and the second sheet pattern includes a channel portion at least partially surrounded by the gate dielectric film, and a protruding portion protruding from a side surface of the gate dielectric film. The contact insertion film extends along the side surface of the gate dielectric film, the sides of the gate spacer, and the protruding portion. Each of the first sheet pattern and the second sheet pattern forms an ohmic contact with the contact insertion film.

A method for fabricating a semiconductor device includes providing a substrate. An active pattern spaced apart from the substrate and extending in a first direction is formed. The active pattern includes a two-dimensional semiconductor material. A gate dielectric film which at least partially surrounds a periphery of the active pattern is formed. An end portion of the active pattern is protruded from a side surface of the gate dielectric. A gate electrode is formed on the gate dielectric film, the gate electrode extending in a second direction intersecting the first direction, and the active pattern penetrating the gate electrode. A contact insertion film is formed on the side surface of the gate electrode. The contact insertion film forms an ohmic contact with the active pattern and extends along the end portion of the active pattern. A filling metal film is formed on the contact insertion film.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

In the present specification, although terms such as first and second are used to describe various elements or components, these elements or components are not necessarily limited by these terms. These terms are used to distinguish a single element or component from other elements or components. Therefore, a first element or component referred to below may be a second element or component within the technical idea of the present disclosure.

Hereinafter, a semiconductor device according to exemplary embodiments of the present disclosure will be described referring to FIGS. 1 to 15.

Figure 1:
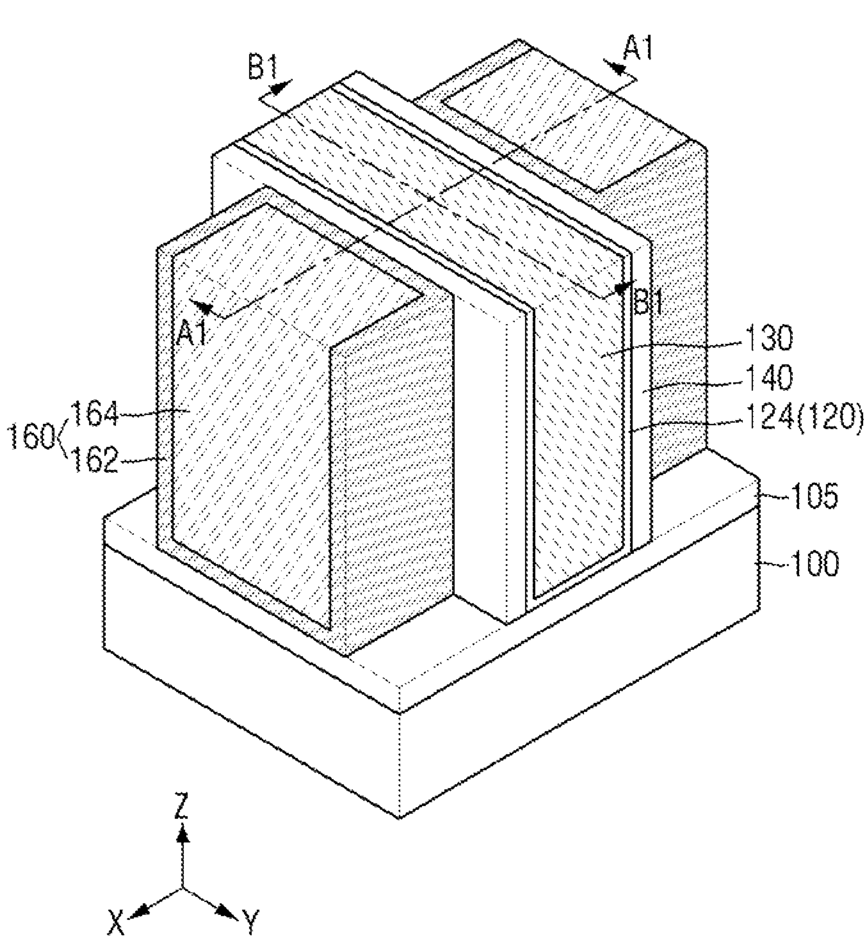
FIG. 1 is an exemplary perspective view illustrating a semiconductor device according to embodiments of the present disclosure.
Figure 2:
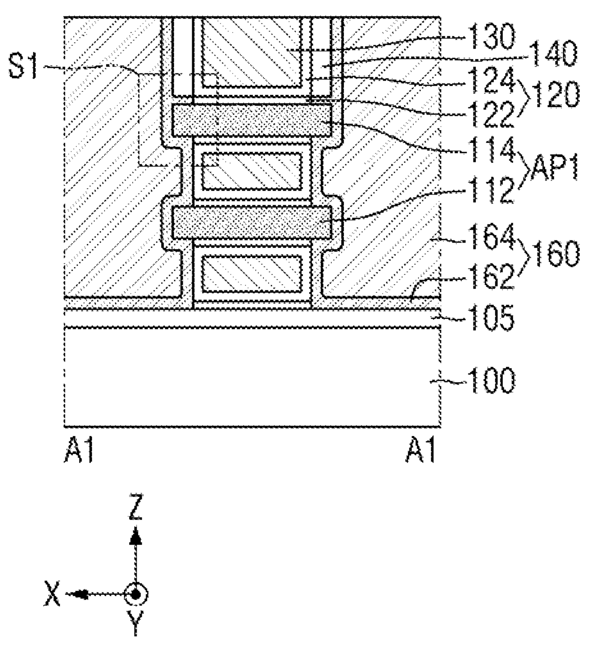
FIG. 2 is a cross-sectional view taken along A1-A1 of FIG. 1.
Figure 3A:
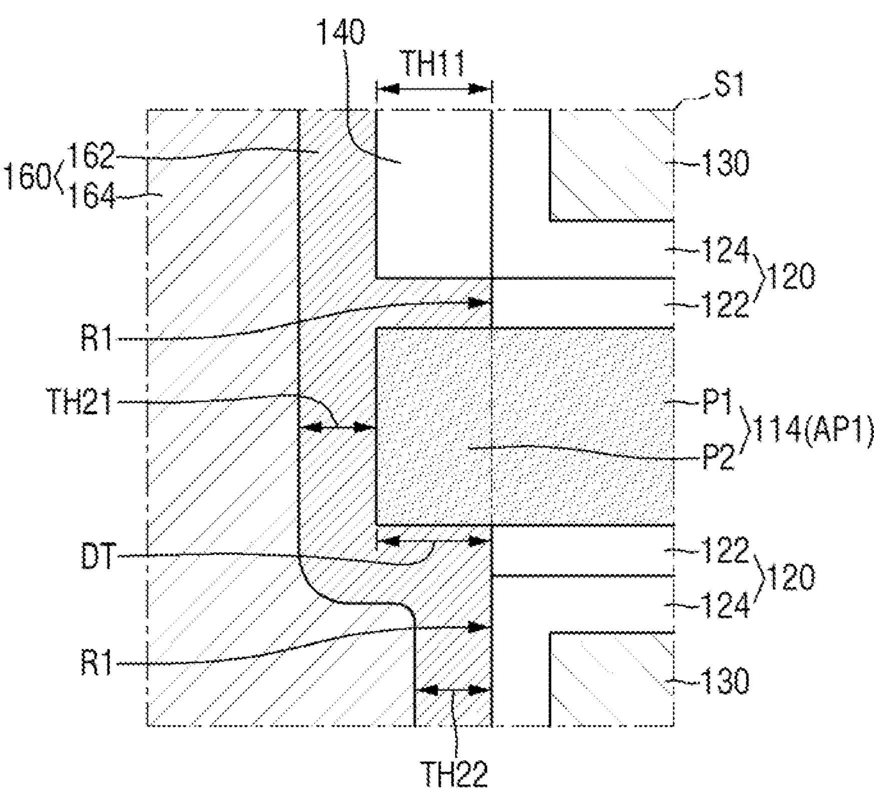
FIGS. 3A, 3B, 3C, and 3D are various enlarged views illustrating a region S1 of FIG. 2.
Figure 3B:
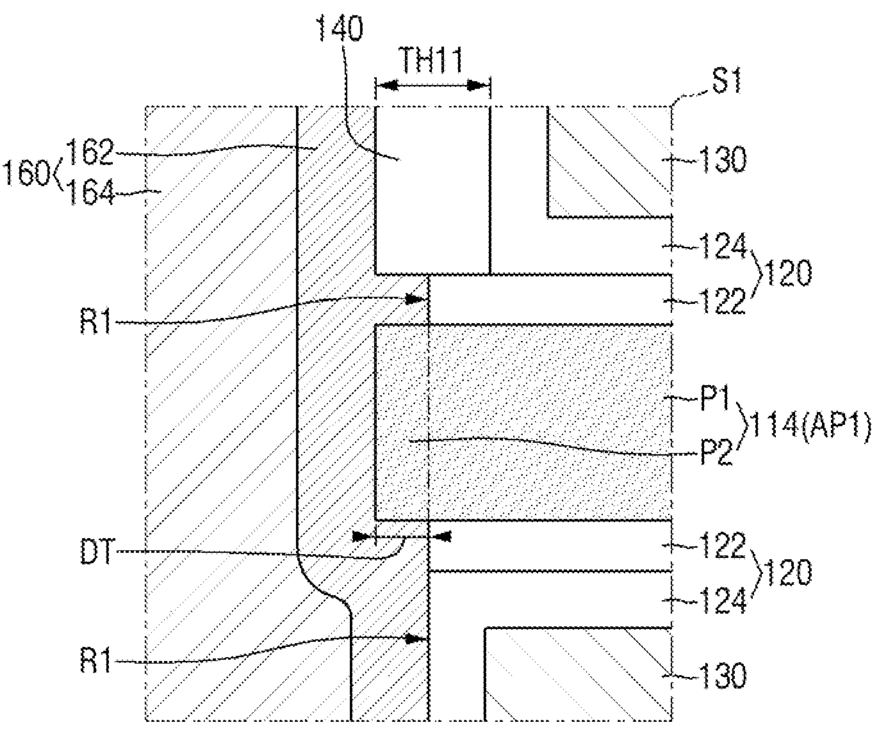
Figure 3C:
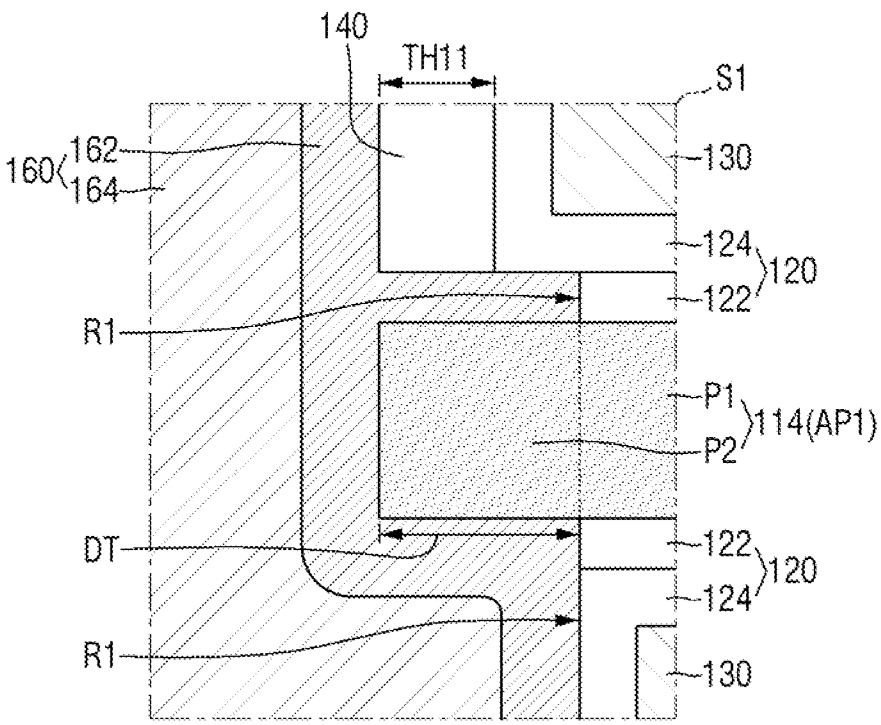
Figure 3D:
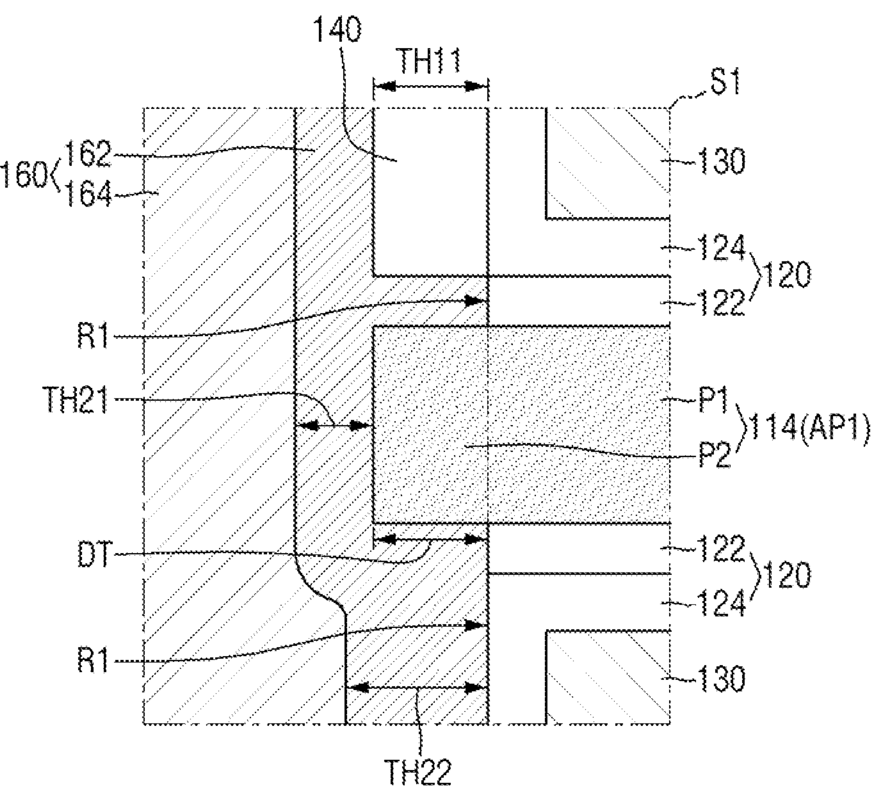
Figure 4:
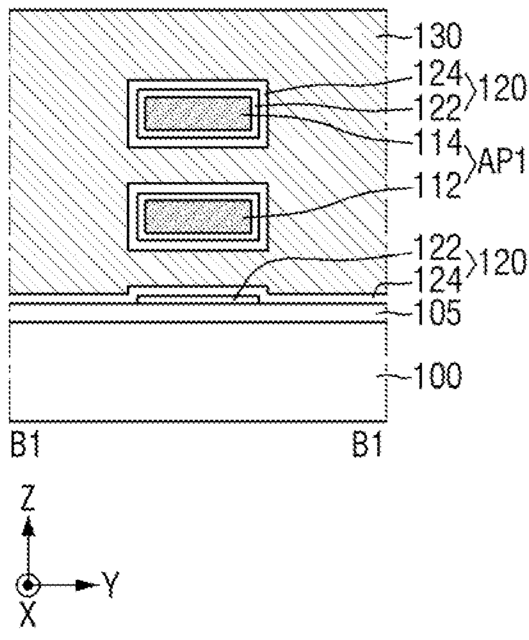
FIG. 4 is a cross-sectional view taken along line B1-B1 of FIG. 1.
Figure 5:
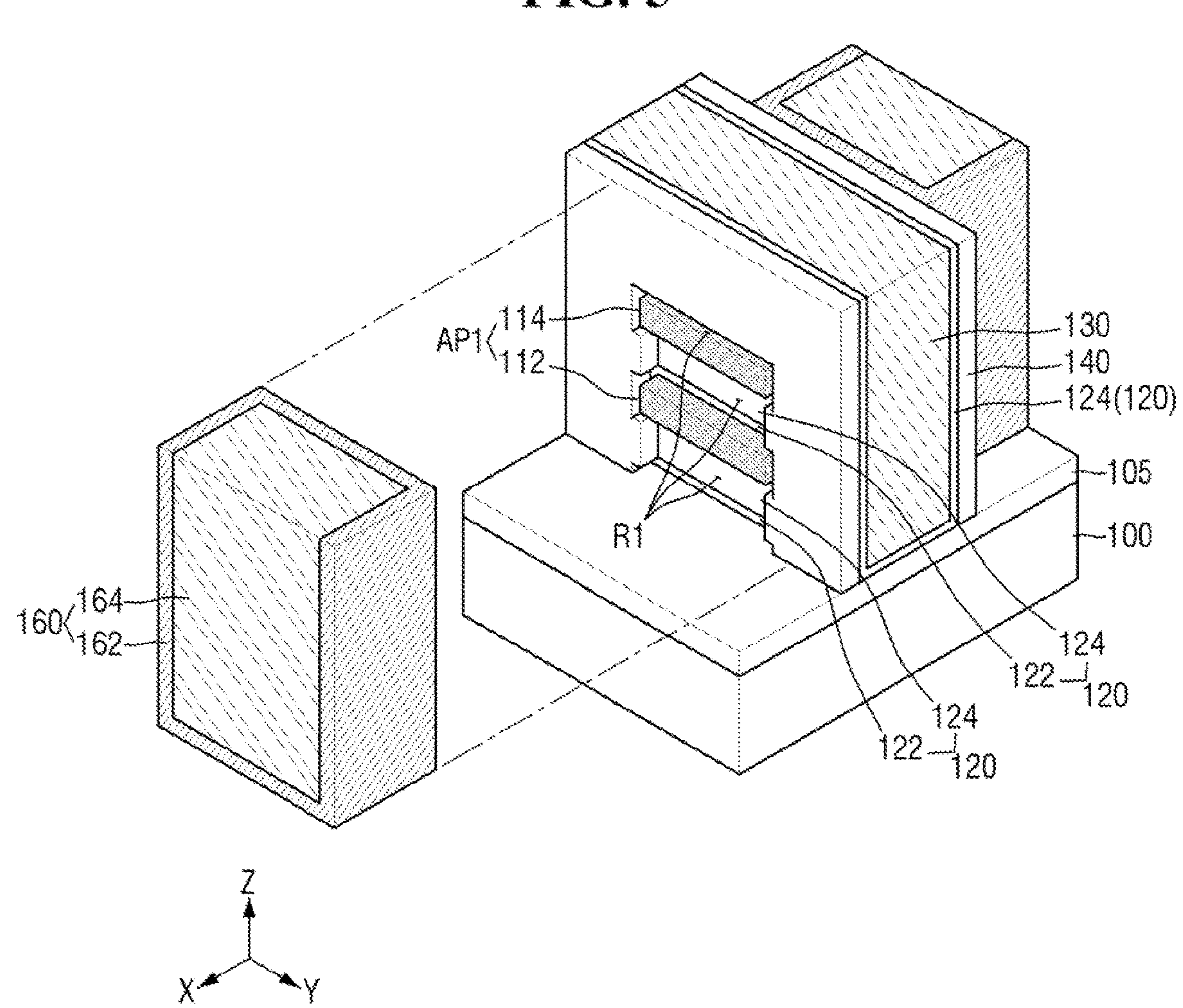
FIG. 5 is a partially exploded perspective view illustrating the semiconductor device of FIGS. 2 to 4.
Figure 6A:
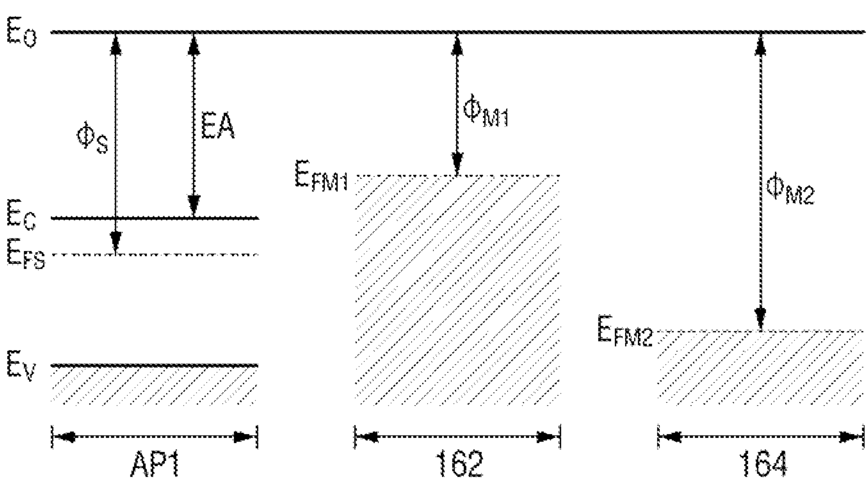
FIGS. 6A and 6B are band diagrams illustrating a source/drain contact of the semiconductor device according to embodiments of the present disclosure.
Figure 6B:
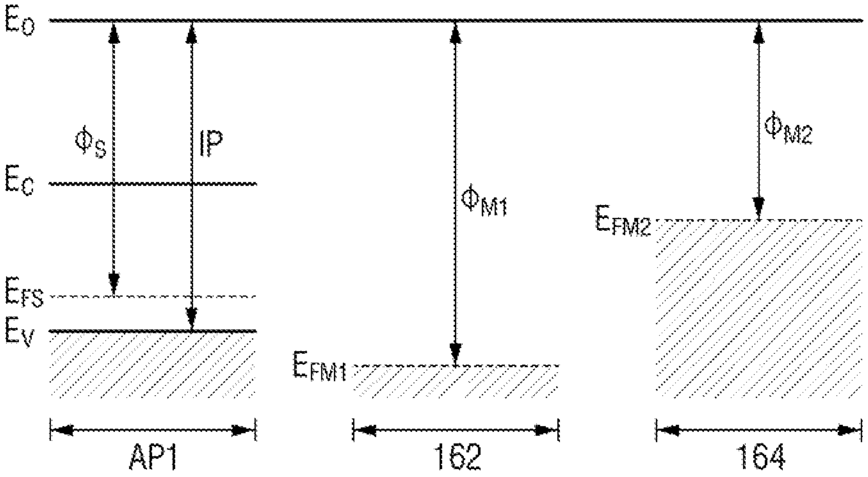

FIG. 1 is an exemplary perspective view illustrating a semiconductor device according to embodiments of the present disclosure. FIG. 2 is a cross-sectional view taken along A1-A1 of FIG. 1. FIGS. 3A to 3D are various enlarged views illustrating a region S1 of FIG. 2. FIG. 4 is a cross-sectional view taken along line B1-B1 of FIG. 1. FIG. 5 is a partially exploded perspective view illustrating the semiconductor device of FIGS. 2 to 4. FIGS. 6A and 6B are band diagrams illustrating a source/drain contact of the semiconductor device according to embodiments of the present disclosure.

Referring to FIGS. 1 to 5, a semiconductor device according to embodiments of the present disclosure includes a substrate 100, a first etching blocking film 105, a first active pattern AP1, a first gate dielectric film 120, a first gate electrode 130, a first gate spacer 140, and a first source/drain contact 160.

The substrate 100 may be bulk silicon or silicon-on-insulator (SOI). Alternatively, the substrate 100 may be a silicon substrate, or may include other materials, for example, silicon germanium, silicon germanium on insulator (SGOI), indium antimonide, lead tellurium compounds, indium arsenide, indium phosphide, gallium arsenide or gallium antimonide.

Alternatively, the substrate 100 may have an epitaxial layer formed on the base substrate. For convenience of explanation, the substrate 100 will be described below as a silicon substrate.

The first etching blocking film 105 may be formed on the substrate 100. The first etching blocking film 105 may cover at least a part of an upper surface of the substrate 100. The first etching blocking film 105 may include, but is not necessarily limited to including, an insulating material, for example, silicon nitride, silicon oxynitride, silicon oxycarbide, silicon boron nitride, silicon boron carbonitride, silicon oxycarbonitride, and/or combinations thereof. As an example, the first etching blocking film 105 may include a silicon nitride film.

The first active pattern AP1 may be formed on the substrate 100 and the first etching blocking film 105. Further, the first active pattern AP1 may be spaced apart from the substrate 100 and the first etching blocking film 105. The first active pattern AP1 may extend in a first direction X that is parallel to the upper surface of the substrate 100.

In embodiments of the present disclosure, the first active pattern AP1 may include a plurality of sheet patterns 112 and 114 that are sequentially disposed on the substrate 100 and are spaced apart from each other. For example, the first active pattern AP1 may include a first sheet pattern 112, and a second sheet pattern 114 that is farther than the first sheet pattern 112 from the substrate 100. Such sheet patterns 112 and 114 may be used as channel regions of MBCFET, a multigate device produced by Samsung, including a multi-bridge channel.

The first active pattern AP1 may include a two-dimensional semiconductor material. The two-dimensional semiconductor material may include, for example, but is not necessarily limited to including, graphene, carbon nanotube, transition metal dichalcogenide (TMD) or combinations thereof. The transition metal dichalcogenide (TMD) may include, for example, Mo, W, Nb, V, Ta, Ti, Zr, Hf, Tc, Re, Cu, Ga, In, Sn, Ge and/or Pb, and S, Se and/or Te. The first active pattern AP1 may include a single layer or multiple layers of the above-mentioned two-dimensional semiconductor material. In embodiments of the present disclosure, the first active pattern AP1 may include the transition metal dichalcogenide (TMD).

The first gate electrode 130 may be formed on the substrate 100 and the first etching blocking film 105. The first gate electrode 130 may intersect the first active pattern AP1. For example, the first gate electrode 130 may extend in a second direction Y that is parallel to the upper surface of the substrate 100 and intersects the first direction X. The first active pattern AP1 may extend in the first direction X and penetrate the first gate electrode 130. Such a first gate electrode 130 may at least partially surround the periphery of the first active pattern AP1.

The first gate electrode 130 may include a conductive material, for example, but is not necessarily limited to including, TiN, WN, TaN, Ru, TiC, TaC, Ti, Ag, Al, TiAl, TiAlN, TiAlC, TaCN, TaSiN, Mn, Zr, W and/or a combination thereof. The first gate electrode 130 may be formed through a replacement process, but is not necessarily limited thereto.

Although the first gate electrode 130 is shown as a single film, this is merely an example, and the first gate electrode 130 may be formed by stacking a plurality of conductive layers. For example, the first gate electrode 130 may include a work function film that adjusts a work function, and a filling conductive film that fills a space formed by the work function film. The work function film may include, for example, but is not necessarily limited to including, TiN, TaN, TiC, TaC, TiAlC, and/or combinations thereof. The filling conductive film may include, for example, but is not necessarily limited to including, W and/or Al.

In embodiments of the present disclosure, the first gate electrode 130 may be electrically separated (e.g., insulated) from the substrate 100 by the first etching blocking film 105. For example, the first etching blocking film 105 may completely cover the upper surface of the substrate 100.

The first gate dielectric film 120 may be interposed between the first active pattern AP1 and the first gate electrode 130. For example, the first gate dielectric film 120 may at least partially surround the periphery of the first active pattern AP1, and the first gate electrode 130 may be stacked on the first gate dielectric film 120. The first gate dielectric film 120 may be interposed between the first etching blocking film 105 and the first gate electrode 130.

The first gate dielectric film 120 may include a dielectric material, for example, silicon oxide, silicon oxynitride, silicon nitride and/or a high dielectric constant material having a higher dielectric constant than silicon oxide. The high dielectric constant material may include, for example, but is not necessarily limited to including, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and/or combinations thereof.

The first gate spacer 140 may be formed on the substrate 100 and the first etching blocking film 105. Further, the first gate spacer 140 may be formed on the side surface of the first gate electrode 130. For example, the first gate spacer 140 may extend in the second direction Y along the side surface of the first gate electrode 130. The first active pattern AP1 may extend in the first direction X and may penetrate the first gate spacer 140.

The first gate spacer 140 may include an insulating material, for example, but is not necessarily limited to including, silicon nitride, silicon oxynitride, silicon oxycarbide, silicon boron nitride, silicon boron carbonitride, silicon oxycarbonitride, and/or combinations thereof.

In embodiments of the present disclosure, the first gate dielectric film 120 may include a first sub-dielectric film 122 and a second sub-dielectric film 124 that are sequentially stacked on the first active pattern AP1.

The first sub-dielectric film 122 may at least partially surround the periphery of the first active pattern AP1. For example, the first sub-dielectric film 122 may conformally extend along the periphery of the first active pattern AP1.

The second sub-dielectric film 124 may at least partially surround the periphery of the first sub-dielectric film 122. Further, a part of the second sub-dielectric film 124 may be interposed between the first gate electrode 130 and the first gate spacer 140. For example, the second sub-dielectric film 124 may conformally extend along the profile of the periphery of the first sub-dielectric film 122 and the periphery of the inner surface of the first gate spacer 140.

The first sub-dielectric film 122 and the second sub-dielectric film 124 may include the same dielectric material as each other, or may include different dielectric materials from each other. Although only an example in which there is a boundary between the first sub-dielectric film 122 and the second sub-dielectric film 124 is shown, this is only exemplary. In some cases, there may be no boundary between the first sub-dielectric film 122 and the second sub-dielectric film 124. In other embodiments, the first sub-dielectric film 122 may be omitted.

An end portion of the first active pattern AP1 may protrude from the side surface of the first gate dielectric film 120. For example, as shown in FIG. 3A, the first active pattern AP1 may include a channel portion P1 and a protruding portion P2. The channel portion P1 and the protruding portion P2 may be arranged along a first direction X in which the first active pattern AP1 extends. The channel portion P1 may be a central portion of the first active pattern AP1 at least partially surrounded by the first gate dielectric film 120. The protruding portion P2 may be an end portion of the first active pattern AP1 protruding from the outer surface of the first gate dielectric film 120.

In embodiments of the present disclosure, side surfaces of the first gate dielectric film 120 may be recessed from the outer surface of the first gate spacer 140. For example, the outer surface of the first gate dielectric film 120 may define a first recess R1 that is recessed from the outer surface of the first gate spacer 140.

In FIG. 3A, although a depth DT at which the first recess R1 is formed is shown as being the same as a thickness TH11 of the first gate spacer 140, this is only exemplary. For example, as shown in FIG. 3B, the depth DT at which the first recess R1 is formed may be smaller than the thickness TH11 of the first gate spacer 140. For example, as shown in FIG. 3C, the depth DT at which the first recess R1 is formed may be greater than the thickness TH11 of the first gate spacer 140.

In embodiments of the present disclosure, the side surfaces of the first active pattern AP1 may be disposed on the same surface (i.e., on the same plane) as the outer surface of the first gate spacer 140. However, in the present specification, the term "same" means not only exactly the same thing but also includes minute differences that may occur due to process margins and the like.

The first source/drain contact 160 may be formed on the substrate 100 and the first etching blocking film 105. Further, the first source/drain contact 160 may be formed on at least one side surface (e.g., both side surfaces) of the first gate electrode 130. For example, the first source/drain contact 160 may extend in a third direction Z that intersects the upper surface of the substrate 100 on the side surface of the first gate electrode 130. Such a first source/drain contact 160 may be connected to at least one end portion of the first active pattern AP1. For example, the first active pattern AP1 penetrates the first gate electrode 130 and the first gate spacer 140, and may be connected to the first source/drain contact 160. The first source/drain contact 160 may be electrically separated from the first gate electrode 130 by the first gate dielectric film 120 and/or the first gate spacer 140.

The first source/drain contact 160 may include a first contact insertion film 162 and a first filling metal film 164 that are stacked sequentially on the upper surface of the substrate 100 (or the first etching blocking film 105) and the side surfaces of the first gate electrode 130.

The first contact insertion film 162 may at least partially surround the protruding end portion of the first active pattern AP1 (e.g., the protruding portion P2 of FIG. 3A). For example, the first contact insertion film 162 may extend along the outer surface of the first gate dielectric film 120, the outer surface of the first gate spacer 140, and the protruding portion P2 of the first active pattern AP1. As shown in FIGS. 2 and 5, such a first contact insertion film 162 may at least partially surround a lower surface, a side surface and an upper surface of the end portion (e.g., the protruding portion P2 of FIG. 3A) of the first active pattern AP1 exposed by the first gate spacer 140 and the first gate dielectric film 120.

In embodiments of the present disclosure, the first contact insertion film 162 may extend conformally along the outer surface of the first gate dielectric film 120, the outer surface of the first gate spacer 140, and the protruding portion P2 of the first active pattern AP1. For example, as shown in FIG. 3A, a thickness TH21 of the first contact insertion film 162 extending along the side surface of the protruding portion P2 may be the same as a thickness TH22 of the first contact insertion film 162 extending along the first recess R1. However, this is only exemplary, and the thickness of the first contact insertion film 162 may be various depending on characteristics of a process for forming the first contact insertion film 162 (e.g., a deposition process). For example, as shown in FIG. 3D, the thickness TH22 of the first contact insertion film 162 extending along the first recess R1 may be greater than the thickness TH21 of the first contact insertion film 162 extending along the side surface of the protruding portion P2.

The first contact insertion film 162 may be in direct contact with the end portion of the first active pattern AP1 (e.g., the protruding portion P2 of the FIG. 3A) to form an ohmic contact. For example, when the first active pattern AP1 includes a two-dimensional semiconductor material used as a channel region of a NFET, the work function of the first contact insertion film 162 may be smaller than the work function of the two-dimensional semiconductor material. Alternatively, for example, when the first active pattern AP1 includes a two-dimensional semiconductor material used as a channel region of a PFET, the work function of the first contact insertion film 162 may be greater than the work function of the two-dimensional semiconductor material. Therefore, a contact resistance between the first active pattern AP1 and the first source/drain contact 160A and 160B may be reduced.

The first contact insertion film 162 that forms an ohmic contact with the first active pattern AP1 may include, for example, a semimetal material. The semimetal material may include, for example, but is not necessarily limited to including, arsenic (As), antimony (Sb), bismuth (Bi), tin (Sn), indium (In), ruthenium (Ru) or an allotrope of carbon such as graphite.

The first filling metal film 164 may be stacked on the first contact insertion film 162. The first filling metal film 164 may fill regions of the first source/drain contacts 160A and 160B that remain after the first contact insertion film 162 is formed. The first filling metal film 164 may include, for example, but is not necessarily limited to including, metallic materials such as nickel (Ni), palladium (Pd), gold (Au), titanium (Ti), silver (Ag), aluminum (Al), tungsten (W), copper (Cu), manganese (Mn), and/or zirconium (Zr).

Hereinafter, contact between the first active pattern AP1 and the first source/drain contact 160 in the semiconductor device according to embodiments of the present disclosure will be described more specifically referring to FIGS. 6A and 6B. For reference, in FIGS. 6A and 6B, a work function $\phi_S$ of the first active pattern AP1 may be defined as a difference between a vacuum level $E_0$ and a Fermi level $E_{FS}$ of the first active pattern AP1. The work function $\phi_{M1}$ of the first contact insertion film 162 may be defined as a difference between the vacuum level $E_0$ and the Fermi level $E_{FM1}$ of the first contact insertion film 162, and the work function $\phi_{M2}$ of the first filling metal film 164 may be defined as a difference between the vacuum level $E_0$ and the Fermi level $E_{FM2}$ of the first filling metal film 164.

FIG. 6A shows a case where the first active pattern AP1 includes a two-dimensional semiconductor material used as the channel region of the NFET. In this case, the work function $\phi_{M1}$ of the first contact insertion film 162 may be smaller than the work function 4*s* of the two-dimensional semiconductor material, and the work function $\phi_{M2}$ of the first filling metal film 164 may be greater than the work function $\phi_S$ of the two-dimensional semiconductor material.

As shown, because the work function $\phi_{M1}$ of the first contact insertion film 162 may be smaller than the work function $\phi_S$ of the two-dimensional semiconductor material, the first contact insertion film 162 comes into direct contact with the first active pattern AP1, and may form an ohmic contact. Therefore, the contact resistance between the first active pattern AP1 and the first source/drain contact 160 may be reduced. If the first contact insertion film 162 is not inserted, for example, because the work function $\phi_{M2}$ of the first filling metal film 164 may be greater than the work function 4*s* of the two-dimensional semiconductor material, the first filling metal film 164 comes into direct contact with the first active pattern AP1 and may form a Schottky contact.

In embodiments of the present disclosure, a value obtained by subtracting an electron affinity (EA) of the two-dimensional semiconductor material from the work function $\phi_{M1}$ of the first contact insertion film 162 may be equal to or less than about 0.3 eV (i.e., $\phi_{M1}$−EA≤0.3 eV). Here, the electron affinity (EA) of the two-dimensional semiconductor material may be defined as a difference between a vacuum level $E_0$ and a conduction band minimum (CBM). For example, the value obtained by subtracting the electron affinity (EA) of the two-dimensional semiconductor material from the work function $\phi_{M1}$ of the first contact insertion film 162 may be about 0.1 eV or less (that is, $\phi_{M1}$−EA≤0.1 eV).

In embodiments of the present disclosure, the work function ii of the first contact insertion film 162 may be about 3.0 eV or greater. When the work function ii of the first contact insertion film 162 is smaller than about 3.0 eV, the contact resistance between the first active pattern AP1 and the first source/drain contact 160 may deteriorate. For example, the work function $\phi_{M1}$ of the first contact insertion film 162 may be about 3.4 eV or more.

FIG. 6B shows a case where the first active pattern AP1 includes a two-dimensional semiconductor material used as a channel region of PFET. In this case, the work function mi of the first contact insertion film 162 may be larger than the work function $\phi_S$ of the two-dimensional semiconductor material, and the work function $\phi_{M2}$ of the first filling metal film 164 may be smaller than the work function $\phi_S$ of the two-dimensional semiconductor material.

As shown, because the work function mi of the first contact insertion film 162 may be larger than the work function $\phi_S$ of the two-dimensional semiconductor material, the first contact insertion film 162 comes into direct contact with the first active pattern AP1 and may form an ohmic contact. Therefore, the contact resistance between the first active pattern AP1 and the first source/drain contact 160 may be reduced. If the first contact insertion film 162 is not inserted, because the work function $\phi_{M2}$ of the first filling metal film 164 may be smaller than the work function $\phi_S$ of the two-dimensional semiconductor material, the first filling metal film 164 comes into direct contact with the first active pattern AP1 and may form a Schottky contact.

In embodiments of the present disclosure, the value obtained by subtracting the work function $\phi_{M1}$ of the first contact insertion film 162 from an ionization potential (IP) of the second contact semiconductor material may be about 0.3 eV or less (i.e., IP−$\phi_{M1}$≤0.3 eV). Here, the ionization potential (IP) of the two-dimensional semiconductor material may be defined as a difference between the vacuum level $E_0$ and a valence band maximum (VBM). For example, the value obtained by subtracting the work function $\phi_{M1}$ of the first contact insertion film 162 from the ionization potential (IP) of the second contact semiconductor material may be about 0.1 eV or less (i.e., IP−$\phi_{M1}$≤1:0.1 eV).

In embodiments of the present disclosure, the work function mi of the first contact insertion film 162 may be about 7.0 eV or less. When the work function mi of the first contact insertion film 162 is larger than about 7.0 eV, the contact resistance between the first active pattern AP1 and the first source/drain contact 160 may deteriorate. For example, the work function $\phi_{M1}$ of the first contact insertion film 162 may be about 6.9 eV or less.

A semiconductor device that uses a two-dimensional semiconductor material (e.g., transition metal dichalcogenide (TMD)) as a channel is studied as a plan for increasing mobility and single channel effect (SCE) to increase the performance of the semiconductor device. In a semiconductor device that uses a two-dimensional semiconductor material as a channel, a source/drain region (e.g., an impurity semiconductor region etc.) might not be separately formed.

In such a case, because the source/drain contact including the metal may come into direct contact with the channel, which is the semiconductor material, to form a Schottky contact, there is a problem of a high contact resistance between the channel and the source/drain contact. To solve this problem, a semimetal that forms an ohmic contact with the channel may be used, as the material that comes into contact with the channel including the two-dimensional semiconductor material.

As described above, the semiconductor device, according to embodiments of the present disclosure, can reduce the contact resistance between the first active pattern AP1 and the source/drain contact 160, by including the first contact insertion film 162 forming an ohmic contact with the first active pattern AP1 used as a channel. In particular, since the first contact insertion film 162 may at least partially surround the protruding end portion of the first active pattern AP1 (for example, the protruding portion P2 of FIG. 3A), a contact area between the first active pattern AP1 and the first contact insertion film 162 may be increased. As an example, the first contact insertion film 162 may increase the contact area between the first active pattern AP1 and the first contact insertion film 162, by at least partially surrounding the lower surface, the side surface, and the upper surface of the end portion of the first active pattern AP1. This makes it possible to provide a semiconductor device having further reduced contact resistance and enhanced performance.

Figure 7:
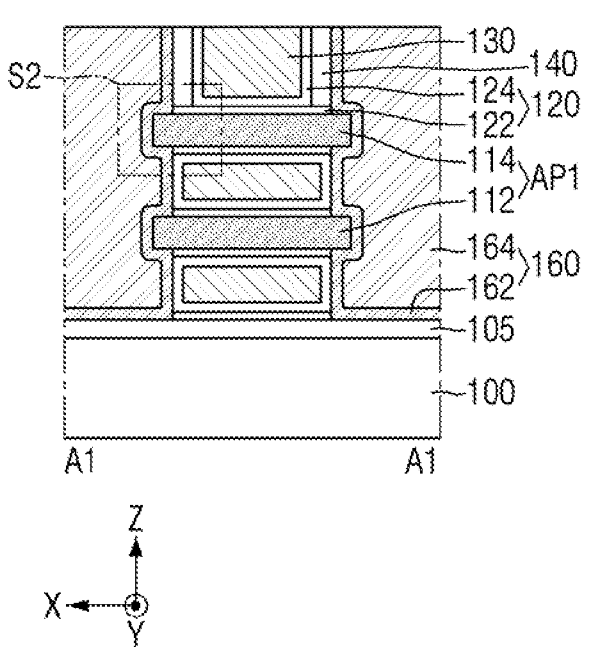
FIG. 7 is an exemplary cross-sectional view illustrating a semiconductor device according to embodiments of the present disclosure.
Figure 8:
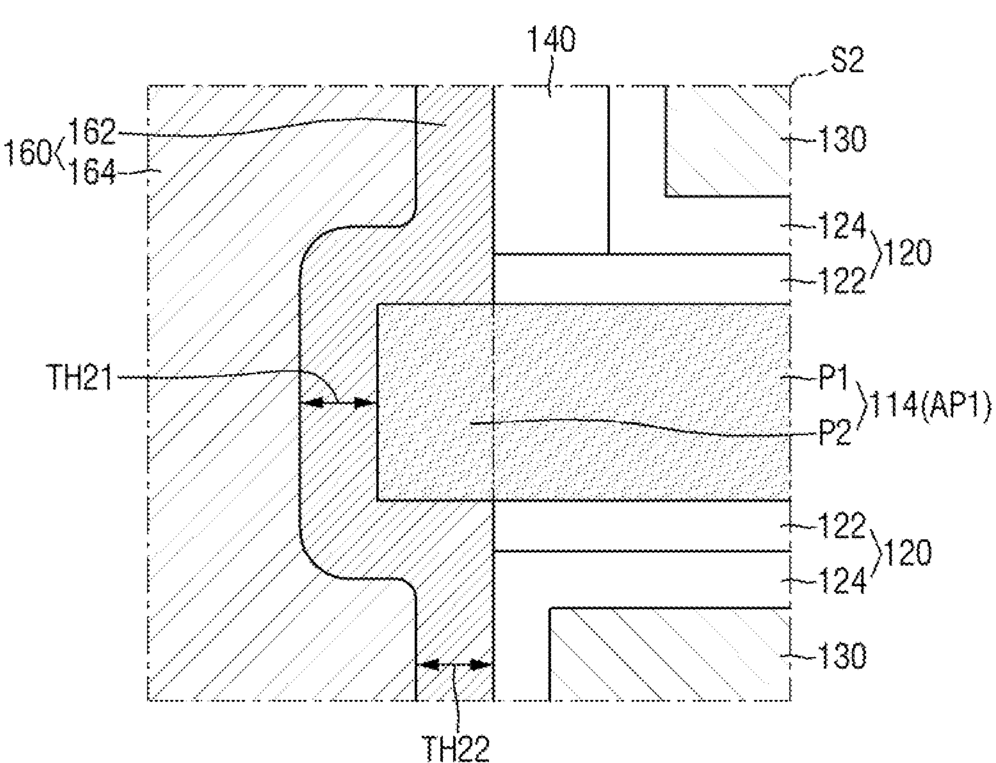
FIG. 8 is an enlarged view illustrating a region S2 of FIG. 7.
Figure 9:
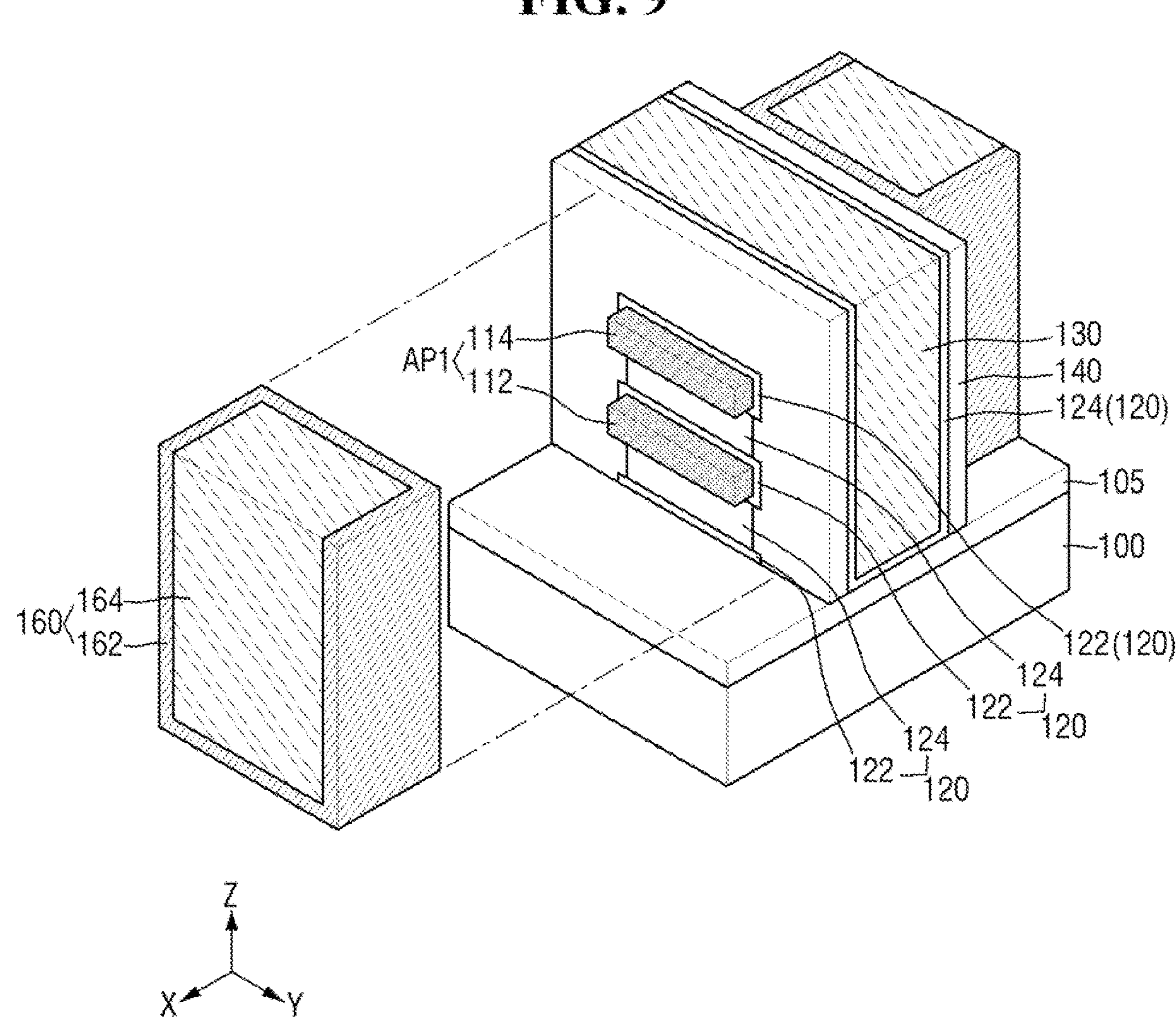
FIG. 9 is a partially exploded perspective view illustrating the semiconductor device of FIGS. 7 and 8.

FIG. 7 is an exemplary cross-sectional view illustrating a semiconductor device according to embodiments of the present disclosure. FIG. 8 is an enlarged view illustrating a region S2 of FIG. 7. FIG. 9 is a partially exploded perspective view illustrating the semiconductor device of FIGS. 7 and 8. For reference, FIG. 7 is another cross-sectional view taken along A1-A1 of FIG. 1. To the extent that a detailed description of a particular element has been omitted, it may be assumed that this element is at least comparable to corresponding elements that have been described elsewhere within the present disclosure.

Referring to FIGS. 7 to 9, in the semiconductor device, according to embodiments of the present disclosure, the end portion of the first active pattern AP1 protrudes from the outer surface of the first gate spacer 140.

For example, a part of the first gate dielectric film 120 may be interposed between the first active pattern AP1 and the first gate spacer 140. As an example, the end portion of the first sub-dielectric film 122 may be interposed between the first active pattern AP1 and the first gate spacer 140. For example the protruding portion P2 may protrude from the outer surface of the first gate dielectric film 120.

In embodiments of the present disclosure, the side surfaces of the first gate dielectric film 120 may be disposed on the same surface (i.e., on the same plane) as the outer surface of the first gate spacer 140. For example, both the side surface of the first sub-dielectric film 122 and the side surface of the second sub-dielectric film 124 may be disposed on the same plane as the outer surface of the first gate spacer 140.

The first contact insertion film 162 may at least partially surround the protruding end portion of the first active pattern AP1 (e.g., the protruding portion P2 of FIG. 8). For example, the first contact insertion film 162 may extend along the outer surface of the first gate dielectric film 120, the outer surface of the first gate spacer 140, and the protruding portion P2 of the first active pattern AP1. As shown in FIGS. 7 and 9, such a first contact insertion film 162 may at least partially surround the lower surface, the side surface, and the upper surface of the end portion (e.g., the protruding portion P2 of FIG. 8) of the first active pattern AP1 exposed by the first gate spacer 140 and the first gate dielectric film 120.

In embodiments of the present disclosure, the first contact insertion film 162 may extend conformally along the outer surface of the first gate dielectric film 120, the outer surface of the first gate spacer 140, and the protruding portion P2 of the first active pattern AP1. For example, as shown in FIG. 8, the thickness TH21 of the first contact insertion film 162 extending along the side surface of the protruding portion P2 may be the same as the thickness TH22 of the one contact insertion film 162 extending along the outer surface of the first gate dielectric film 120. However, this is only exemplary, and the thickness of the first contact insertion film 162 may be various, depending on the characteristics of the process for forming the first contact insertion film 162 (e.g., the deposition process).

Figure 10:
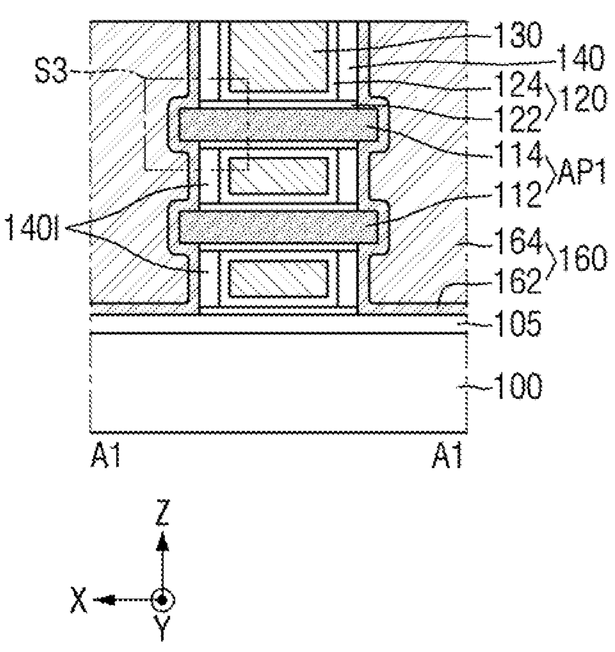
FIG. 10 is an exemplary cross-sectional view illustrating a semiconductor device according to embodiments of the present disclosure.
Figure 11:
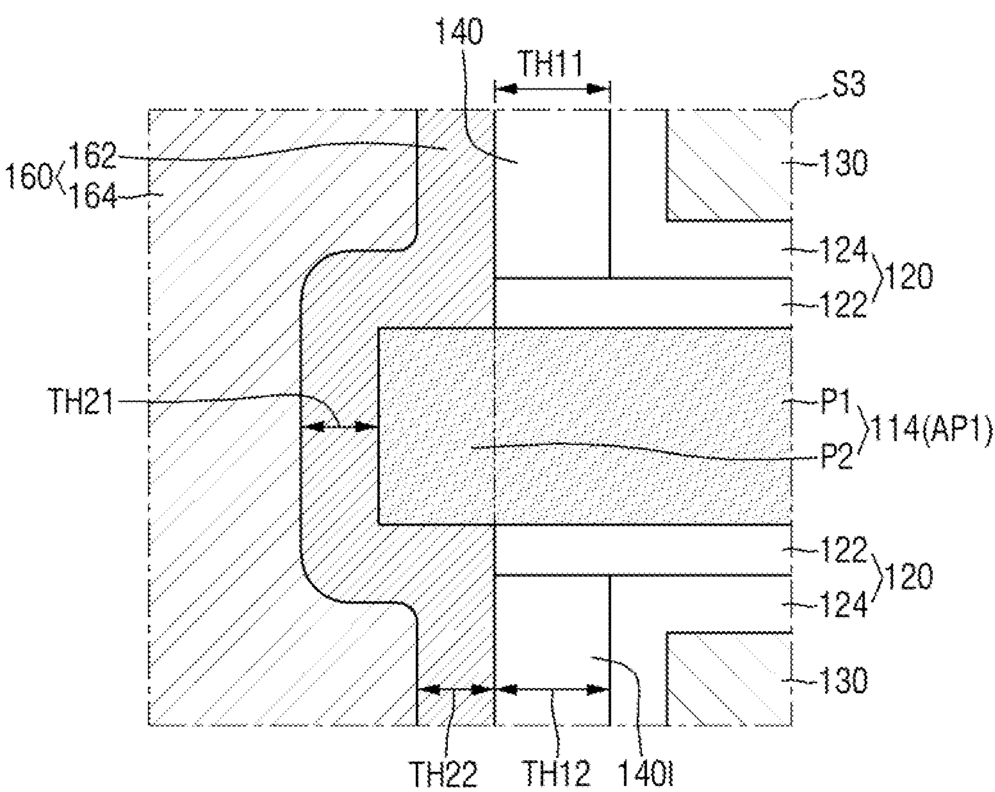
FIG. 11 is an enlarged view illustrating a region S3 of FIG. 10.
Figure 12:
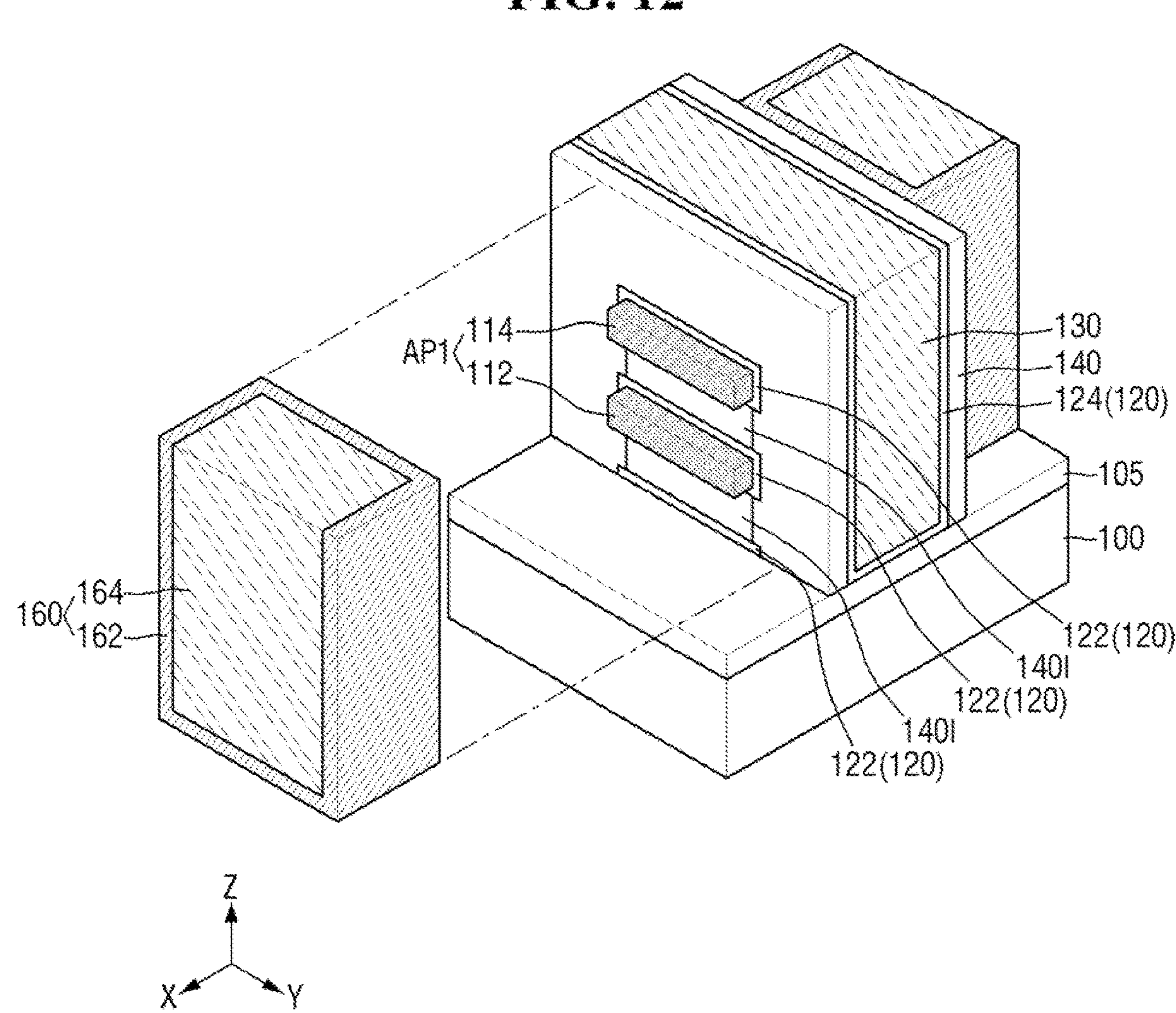
FIG. 12 is a partially exploded perspective view illustrating the semiconductor devices of FIGS. 10 and 11.

FIG. 10 is an exemplary cross-sectional view illustrating a semiconductor device according to embodiments of the present disclosure. FIG. 11 is an enlarged view illustrating a region S3 of FIG. 10. FIG. 12 is a partially exploded perspective view illustrating the semiconductor devices of FIGS. 10 and 11. For reference, FIG. 10 is another cross-sectional view taken along A1-A1 of FIG. 1. To the extent that a detailed description of a particular element has been omitted, it may be assumed that this element is at least comparable to corresponding elements that have been described elsewhere within the present disclosure.

Referring to FIGS. 10 to 12, the semiconductor device, according to embodiments of the present disclosure, further includes a first inner spacer 1401.

The first inner spacer 1401 may be formed on the side surface of the first gate electrode 130 between the sheet patterns 112 and 114. Further, the first inner spacer 1401 may be formed on the side surface of the first gate electrode 130 between the substrate 100 and the sheet patterns 112 and 114.

The first inner spacer 1401 may include an insulating material, for example, but is not necessarily limited to including, silicon nitride, silicon oxynitride, silicon oxycarbide, silicon boron nitride, silicon boron carbonitride, silicon oxycarbonitride, and/or combinations thereof. The first source/drain contact 160 may be electrically separated from the first gate electrode 130 by the first gate spacer 140 and/or the first inner spacer 1401.

The first inner spacer 1401 may include the same insulating material as the first gate spacer 140, and may include a different insulating material from the first gate spacer 140. In an example, a dielectric constant of the first inner spacer 1401 may be different from that of the first gate spacer 140.

The first contact insertion film 162 may at least partially surround the protruding end portion of the first active pattern AP1 (e.g., the protruding portion P2 of FIG. 11). For example, the first contact insertion film 162 may extend along the outer surface of the first inner spacer 1401, the outer surface of the first gate spacer 140, and the protruding portion P2 of the first active pattern AP1. As shown in FIGS. 10 and 12, such a first contact insertion film 162 may at least partially surround the lower surface, the side surface and the upper surface of the end portion (for example, the protruding portion P2 of FIG. 11) of the first active pattern AP1 exposed by the first gate spacer 140, the first gate dielectric film 120 and the first inner spacer 1401.

In embodiments of the present disclosure, the first contact insertion film 162 may conformally extend along an outer surface of the first sub-dielectric film 122, an outer surface of the first inner spacer 1401, an outer surface of the first gate spacer 140, and the protruding portion P2 of the first active pattern AP1. For example, as shown in FIG. 11, the thickness TH21 of the first contact insertion film 162 extending along the side surface of the protruding portion P2 may be the same as the thickness TH22 of the first contact insertion film 162 extending along the outer surface of the first inner spacer 1401. However, this is only exemplary, and the thickness of the first contact insertion film 162 may be various, depending on the characteristics of the process for forming the first contact insertion film 162 (e.g., the deposition process).

Figure 13:
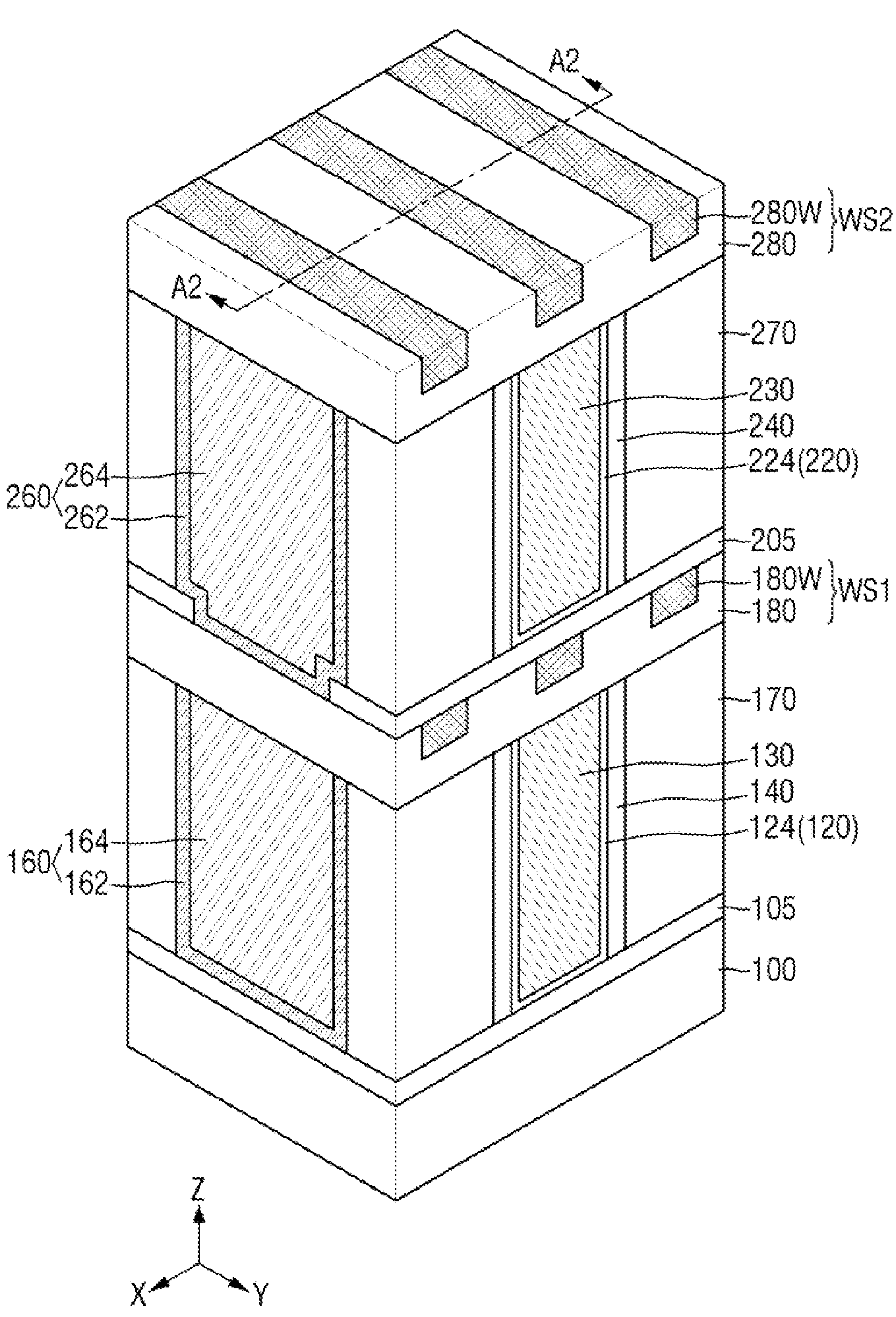
FIG. 13 is an exemplary perspective view illustrating a semiconductor device according to embodiments of the present disclosure.
Figure 14:
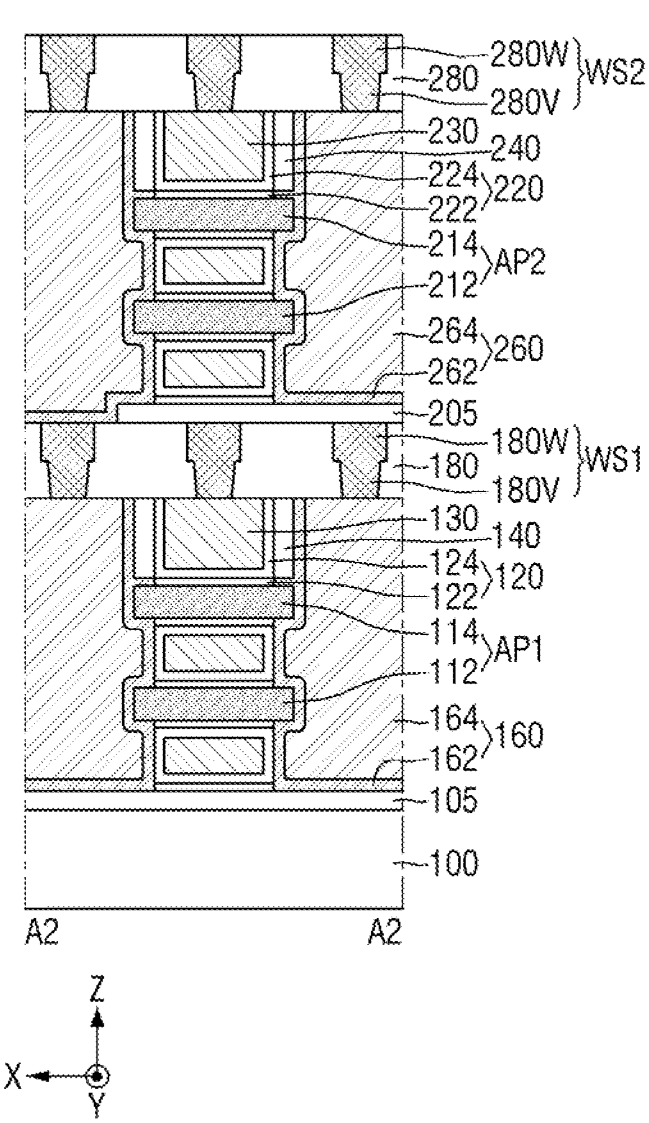
FIGS. 14 and 15 are various cross-sectional views taken along A2-A2 of FIG. 13.
Figure 15:
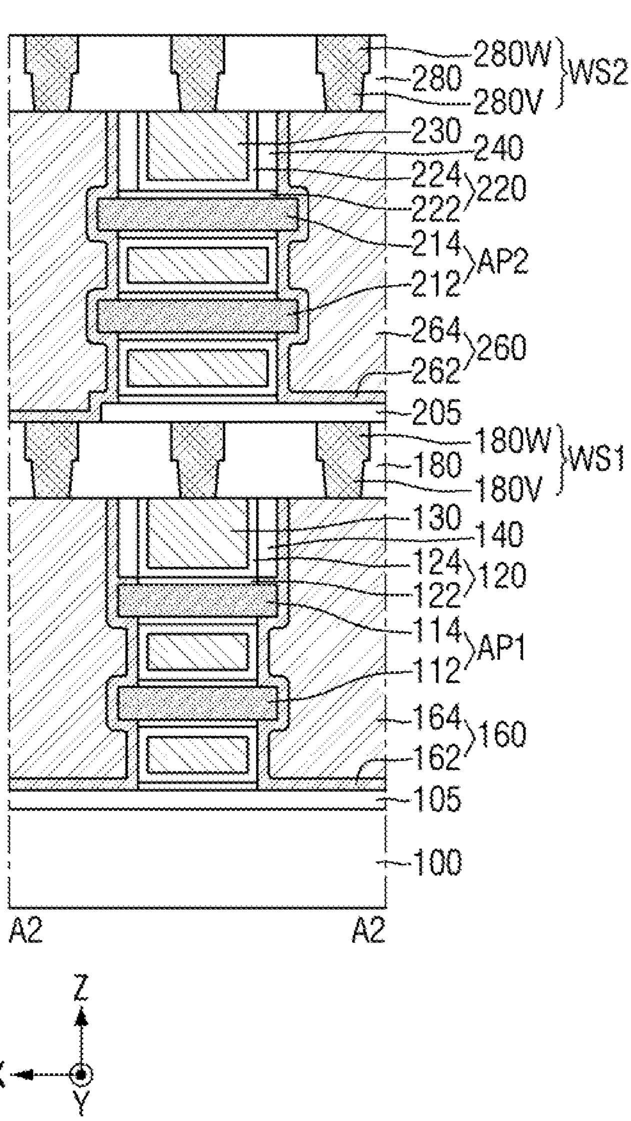

FIG. 13 is an exemplary perspective view illustrating a semiconductor device according to embodiments of the present disclosure. FIGS. 14 and 15 are various cross-sectional views taken along A2-A2 of FIG. 13. To the extent that a detailed description of a particular element has been omitted, it may be assumed that this element is at least comparable to corresponding elements that have been described elsewhere within the present disclosure.

Referring to FIGS. 13 to 15, the semiconductor device, according to embodiments of the present disclosure, further includes a first wiring structure WS1, a second etching blocking film 205, a second active pattern AP2, a second gate dielectric film 220, a second gate electrode 230, a second gate spacer 240, a second source/drain contact 260, and a second wiring structure WS2.

The first wiring structure WS1 may be formed on the first gate electrode 130 and the first source/drain contact 160. For example, a first interlayer insulating film 170 that covers the side surface of the first gate electrode 130 and the side surface of the first source/drain contact 160 may be formed on the substrate 100 and the first etching blocking film 105. The first wiring structure WS1 may be stacked on the upper surface of the first interlayer insulating film 170.

The first wiring structure WS1 may be electrically connected to at least one of the first gate electrode 130 and the first source/drain contact 160. For example, the first wiring structure WS1 may include a first inter-wiring insulating film 180, and first wiring patterns 180W each extending in the second direction Y inside the first inter-wiring insulating film 180. The first wiring patterns 180W may be electrically connected to the first gate electrode 130 and/or the first source/drain contact 160 through the first via patterns 180V extending in the third direction Z inside the first inter-wiring insulating film 180. However, this is only exemplary, the first wiring structure WS1 may be electrically connected to the first gate electrode 130 and/or the first source/drain contact 160 in various other forms.

The second etching blocking film 205, the second active pattern AP2, the second gate dielectric film 220, the second gate electrode 230, the second gate spacer 240, the second source/drain contact 260, and the second wiring structure WS2 may be formed on the first wiring structure WS1. The second etching blocking film 205, the second active pattern AP2, the second gate dielectric film 220, the second gate electrode 230, the second gate spacer 240, the second source/drain contact 260 and the second wiring structure WS2 may be similar to each of the first etching blocking film 105, the first active pattern AP1, the first gate dielectric film 120, the first gate electrode 130, the first gate spacer 140, the first source/drain contact 160 and the first wiring structure WS1, except for stacking on the first wiring structure WS1.

Accordingly, a semiconductor device (hereinafter referred to as a second transistor) including the second active pattern AP2 and the second gate electrode 230 may be stacked on the semiconductor device (hereinafter, a first transistor) including the first active pattern AP1 and the first gate electrode 130.

In embodiments of the present disclosure, the first transistor and the second transistor may be electrically connected. For example, the first transistor and the second transistor may form CMOS (complementary metal-oxide-semiconductor). In one example, the first transistor and the second transistor may form an inverter connected in parallel between a power supply node VDD and a ground node Vss. An input of the inverter may be commonly connected to the first gate electrode 130 and the second gate electrode 230, and an output of the inverter may be commonly connected to a drain of the first transistor (e.g., the first source/drain contact 160 on one side of the first gate electrode 130), and a drain of the second transistor (e.g., the second source/drain contact 260 on one side of the second gate electrode 230).

In embodiments of the present disclosure, the second source/drain contact 260 may penetrate the second etching blocking film 205 and be electrically connected to the first wiring structure WS1. For example, the second etching blocking film 205 may expose a part of the upper surface of the first wiring structure WS1. The lower part of the second source/drain contact 260 may be connected to a part of the first wiring patterns 180W exposed by the second etching blocking film 205. Accordingly, the first transistor and the second transistor may be electrically connected. For example, the first wiring structure WS1 may electrically connect the first source/drain contact 160 and the second source/drain contact 260.

Although FIG. 14 shows that both the first transistor and the second transistor have only the form of the semiconductor device according to FIG. 2, this is only exemplary. The first transistor and the second transistor may independently have one of the semiconductor devices described above in FIGS. 1 to 12. As an example, as shown in FIG. 15, the first transistor may have the form of the semiconductor device according to FIG. 2, and the second transistor may have the form of the semiconductor device according to FIG. 7.

In embodiments of the present disclosure, the first transistor and the second transistor may have different conductive types from each other. In an example, the first transistor may be an NFET and the second transistor may be a PFET. For example, the first transistor may be a PFET and the second transistor may be an NFET.

In embodiments of the present disclosure, the first active pattern AP1 and the second active pattern AP2 may include two-dimensional semiconductor materials that are different from each other. For example, the first active pattern AP1 and the second active pattern AP2 may include transition metal dichalcogenides (TMD) different from each other. As an example, when the first transistor is an NFET and the second transistor is a PFET, the first active pattern AP1 may include $MoS_2$ or $MoSe_2$, and the second active pattern AP2 may include $WS_2$ or $WSe_2$. In other embodiments, the first active pattern AP1 and the second active pattern AP2 may include the same two-dimensional semiconductor material as each other.

In embodiments of the present disclosure, the first gate electrode 130 and the second gate electrode 230 may include different conductive materials from each other. In other embodiments, the first gate electrode 130 and the second gate electrode 230 may include the same conductive material as each other.

In embodiments of the present disclosure, the first gate dielectric film 120 and the second gate dielectric film 220 may include different dielectric materials from each other. In other embodiments, the first gate dielectric film 120 and the second gate dielectric film 220 may include the same dielectric material as each other.

In embodiments of the present disclosure, the first contact insertion film 162 and the second contact insertion film 262 may include different semimetal materials from each other. As an example, when the first transistor is an NFET and the second transistor is a PFET, the first contact insertion film 162 may include at least one of bismuth (Bi), antimony (Sb), tin (Sn) and indium (In), and the second contact insertion film 262 may include ruthenium (Ru). In other embodiments, the first contact insertion film 162 and the second contact insertion film 262 may include the same semimetal material as each other.

In embodiments of the present disclosure, the first filling metal film 164 and the second filling metal film 264 may include different metal materials from each other. In other embodiments, the first filling metal film 164 and the second filling metal film 264 may include the same metal material as each other.

Hereinafter, a method for fabricating a semiconductor device according to an exemplary embodiment of the present disclosure will be described referring to FIGS. 1 to 36.

FIGS. 16 to 24 are intermediate step diagrams illustrating a method for fabricating a semiconductor device according to embodiments of the present disclosure. To the extent that a detailed description of a particular element has been omitted, it may be assumed that this element is at least comparable to corresponding elements that have been described elsewhere within the present disclosure.

Figure 16:
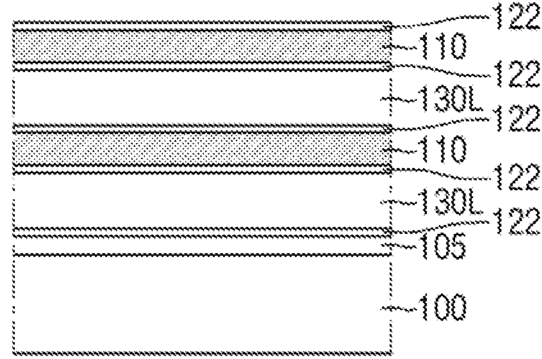
FIG. 16 to 24 are intermediate step diagrams illustrating a method for fabricating a semiconductor device according to embodiments of the present disclosure.
Figure 16:
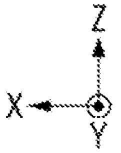

Referring to FIG. 16, the first etching blocking film 105, the first sub-dielectric film 122, a first sacrificial film 130L, and the active film 110 are formed on the substrate 100.

The first etching blocking film 105 may be formed on the substrate 100. The first etching blocking film 105 may cover at least a part of the upper surface of the substrate 100.

The first sacrificial film 130L and the active film 110 may be formed on the substrate 100 (or the first etching blocking film 105). The first sacrificial film 130L and the active film 110 may be alternately stacked on the substrate 100 (or the first etching blocking film 105).

The active film 110 may include a two-dimensional semiconductor material. The two-dimensional semiconductor material may include, for example, but is not necessarily limited to, graphene, carbon nanotube, transition metal dichalcogenide (TMD) or combinations thereof.

The first sacrificial film 130L may include a material having an etching selectivity with respect to the active film 110 and/or the first sub-dielectric film 122. In an example, the first sacrificial film 130L may include, but is not necessarily limited to including, silicon germanium (SiGe).

The first sub-dielectric film 122 may be interposed between the active film 110 and the first sacrificial film 130L. Such a first sub-dielectric film 122 may extend along the lower surface and the upper surface of the active film 110. Further, the first sub-dielectric film 122 may be interposed between the first etching blocking film 105 and the first sacrificial film 130L. The first sub-dielectric film 122 may include a dielectric material, for example, but is not necessarily limited to including, silicon oxide, silicon oxynitride, silicon nitride, and/or a high dielectric constant material having a higher dielectric constant than silicon oxide.

In embodiments of the present disclosure, after the first sub-dielectric film 122, the first sacrificial film 130L, and the active film 110 are formed, a selective deposition process may be performed on the first sub-dielectric film 122. The first sub-dielectric film 122 grown by the selective deposition process may cover the side surfaces of the active film 110. As a result, as shown in FIG. 4, the first sub-dielectric film 122 that at least partially surrounds the periphery of the first active pattern AP1 may be formed.

Figure 17:
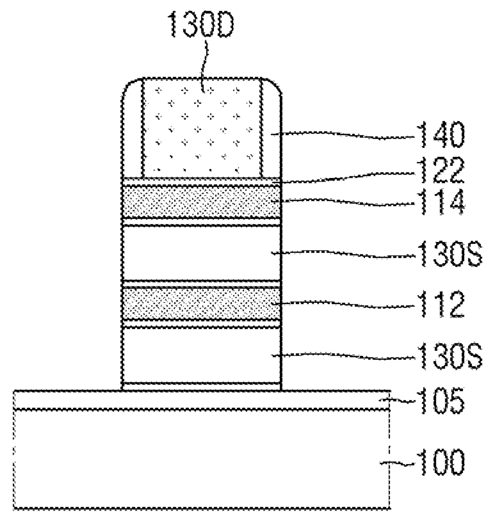
Figure 17:
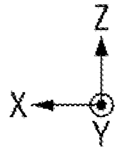

Referring to FIG. 17, a sacrificial pattern 130S and the sheet patterns 112 and 114 are formed.

For example, a dummy gate 130D extending in the second direction Y may be formed on the first sub-dielectric film 122, the first sacrificial film 130L, and the active film 110 of FIG. 16.

Further, the first gate spacer 140 extending along the side surface of the dummy gate 130D may be formed on the first sub-dielectric film 122, the first sacrificial film 130L and the active film 110. After that, an etching process in which the dummy gate 130D and the first gate spacer 140 are used as etching masks may be performed. Therefore, the first sub-dielectric film 122, the first sacrificial film 130L, and the active film 110 may be patterned. The patterned first sacrificial film 130L may form a sacrificial pattern 130S extending in the first direction X, and the patterned active film 110 may form sheet patterns 112 and 114 each extending in the first direction X.

The dummy gate 130D may include a material having an etching selectivity with respect to the active film 110 and/or the first sub-dielectric film 122. In an example, the dummy gate 130D may include, but is not necessarily limited to including, polysilicon (poly Si).

Figure 18:
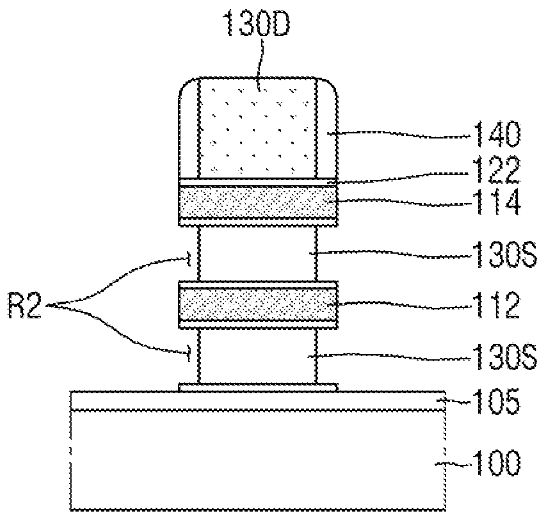
Figure 18:
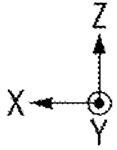

Referring to FIG. 18, a first recess process may be performed on the sacrificial pattern 130S.

As the first recess process is performed, the outer surface of the sacrificial pattern 130S may be selectively recessed. Therefore, the outer surface of the sacrificial pattern 130S may define a second recess R2 that is recessed from the outer surfaces of the sheet patterns 112 and 114, the outer surface of the first sub-dielectric film 122, and/or the outer surface of the first gate spacer 140.

Figure 19:
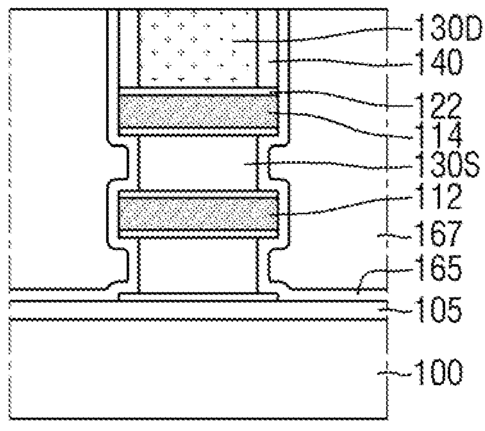
Figure 19:
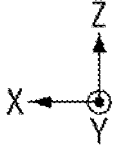

Referring to FIG. 19, a second sacrificial film 165 and a third sacrificial film 167 are formed on the substrate 100 (or the first etching blocking film 105).

The second sacrificial film 165 may extend along the outer surfaces of the sheet patterns 112 and 114, the outer surface of the first sub-dielectric film 122, and the outer surface of the first gate spacer 140. Further, the second sacrificial film 165 may extend along the second recess R2 of FIG. 18. In embodiments of the present disclosure, the second sacrificial film 165 may include a dielectric material, for example, silicon oxide, silicon oxynitride, silicon nitride, and/or a high dielectric constant material having a higher dielectric constant than silicon oxide. The second sacrificial film 165 may include the same dielectric material as the first sub-dielectric film 122, and may include a different dielectric material from the first sub-dielectric film 122. In other embodiments, the second sacrificial film 165 may be omitted.

The third sacrificial film 167 may be stacked on the second sacrificial film 165. The third sacrificial film 167 may fill the region on the substrate 100 (or the first etching blocking film 105) that remains after the second sacrificial film 165 is formed. In embodiments of the present disclosure, the third sacrificial film 167 may include a material having an etching selectivity with respect to the second sacrificial film 165. As an example, the third sacrificial film 167 may include, but is not necessarily limited to, silicon oxide.

Figure 20:
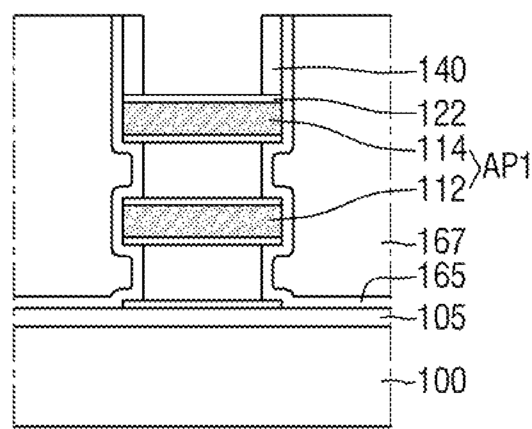
Figure 20:
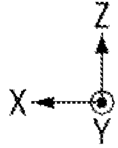

Referring to FIG. 20, the sacrificial pattern 130S and the dummy gate 130D are removed.

Since the sacrificial pattern 130S and the dummy gate 130D may include a material having an etching selectivity with respect to the active film 110 and/or the first sub-dielectric film 122, they may be selectively removed.

Figure 21:
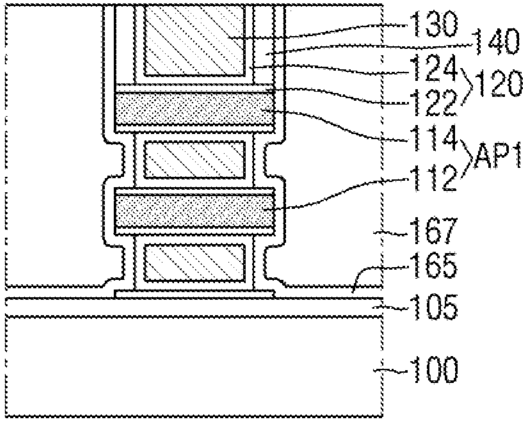
Figure 21:
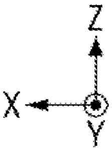

Referring to FIG. 21, the second sub-dielectric film 124 and the first gate electrode 130 are formed.

The second sub-dielectric film 124 may be sequentially stacked around the first sub-dielectric film 122 and on the inner surface of the first gate spacer 140. As a result, the first gate dielectric film 120 including the first sub-dielectric film 122 and the second sub-dielectric film 124 may be formed. The first sub-dielectric film 122 and the second sub-dielectric film 124 may include the same dielectric material as each other, or may include different dielectric materials from each other.

The first gate electrode 130 may be stacked on the second sub-dielectric film 124. The first gate electrode 130 may include a conductive material, for example, but is not necessarily limited to including, TiN, WN, TaN, Ru, TiC, TaC, Ti, Ag, Al, TiAl, TiAlN, TiAlC, TaCN, TaSiN, Mn, Zr, W and/or combinations thereof.

The second sub-dielectric film 124 and the first gate electrode 130 may replace the dummy gate 130D and the sacrificial pattern 130S of FIG. 19. Accordingly, the first gate electrode 130 extending in the second direction Y, and the first active pattern AP1 extending in the first direction X to penetrate the first gate electrode 130 may be formed.

Figure 22:
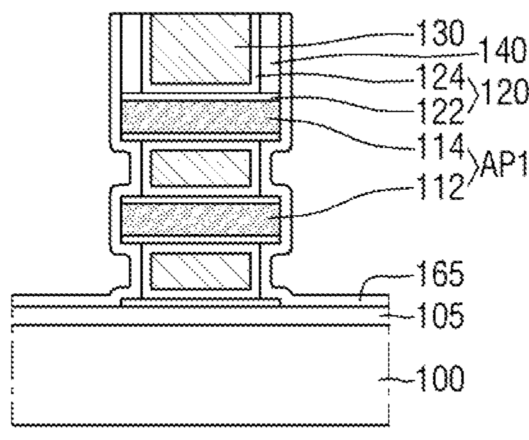
Figure 22:
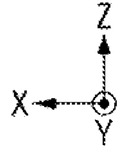

Referring to FIG. 22, the third sacrificial film 167 is removed.

Since the third sacrificial film 167 may include a material having an etching selectivity with respect to the second sacrificial film 165, it may be selectively removed.

Figure 23:
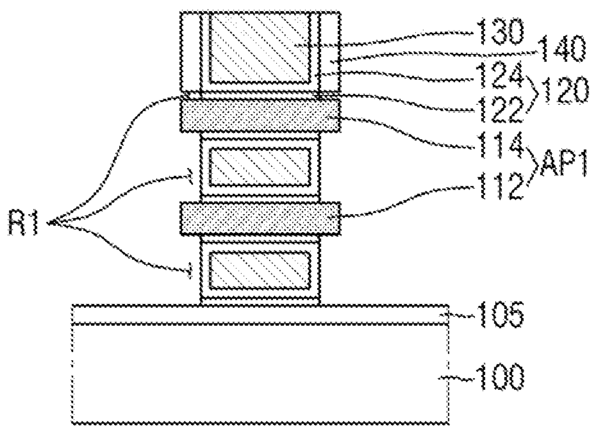
Figure 23:
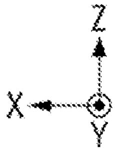

Referring to FIG. 23, a second recess process is performed on the second sacrificial film 165 and the first sub-dielectric film 122.

As the second recess process is performed, the outer surfaces of the second sacrificial film 165 and the first sub-dielectric film 122 may be selectively recessed. Therefore, the outer surface of the first gate dielectric film 120 may define the first recess R1 that is recessed from the outer surface of the first gate spacer 140. Further, the end portion of the first active pattern AP1 may protrude from the side surface of the first gate dielectric film 120.

Figure 24:
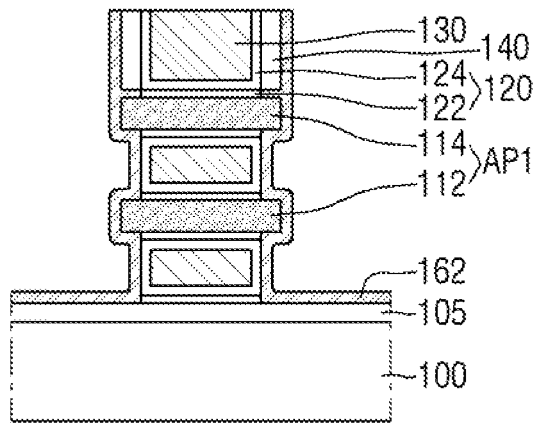
Figure 24:
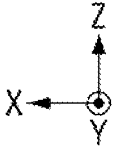

Referring to FIG. 24, the first contact insertion film 162 is formed on the upper surface of the substrate 100 (or the first etching blocking film 105) and the side surface of the first gate electrode 130.

The first contact insertion film 162 may at least partially surround the protruding end portion of the first active pattern AP1. For example, the first contact insertion film 162 may extend along the outer surface of the first gate dielectric film 120, the outer surface of the first gate spacer 140, and the protruding portion P2 of the first active pattern AP1.

The first contact insertion film 162 may come into direct contact with the end portion of the first active pattern AP1 (e.g., the protruding portion P2 of FIG. 3A) to form an ohmic contact.

The first contact insertion film 162 may include a semi-metal material, for example, but is not necessarily limited to including, arsenic (As), antimony (Sb), bismuth (Bi), tin (Sn), indium (In), ruthenium (Ru) and/or allotrope of carbon such as graphite.

Next, as may be seen in FIG. 2, the first filling metal film 164 is formed on the first contact insertion film 162. Accordingly, the semiconductor device explained using FIGS. 2 to 5 may be fabricated.

Figure 25:
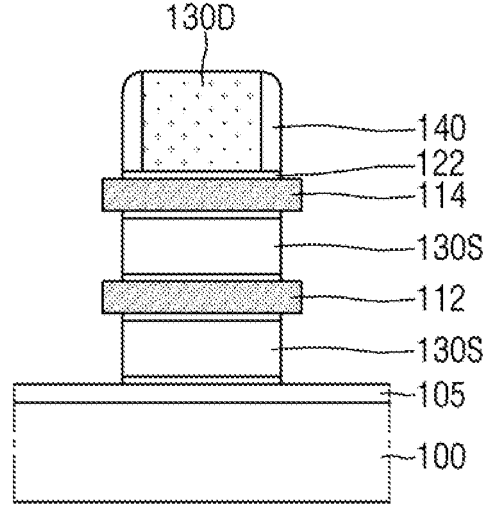
FIG. 25 to 27 are intermediate process diagrams illustrating a method for fabricating a semiconductor device according to embodiments of the present disclosure.
Figure 25:
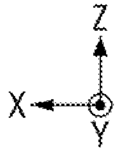
Figure 26:
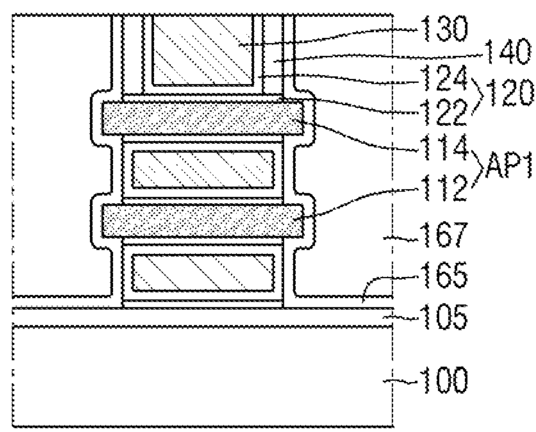
Figure 26:
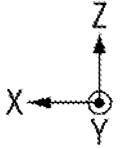
Figure 27:
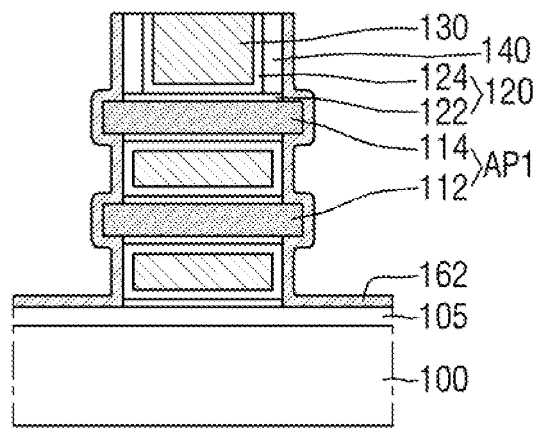
Figure 27:
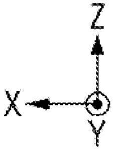

FIGS. 25 to 27 are intermediate process diagrams illustrating a method for fabricating a semiconductor device according to embodiments of the present disclosure. To the extent that a detailed description of a particular element has been omitted, it may be assumed that this element is at least comparable to corresponding elements that have been described elsewhere within the present disclosure. For reference, FIG. 25 is an intermediate step diagram illustrating the step after FIG. 17.

Referring to FIG. 25, a selective growth process is performed on the sheet patterns 112 and 114.

The selective growth process may include, but is not necessarily limited to including, for example, a crystal growth process on the sheet patterns 112 and 114. As the selective growth process is performed, the end portions of the sheet patterns 112 and 114 may protrude from the outer surface of the first gate dielectric film 120 and/or the outer surface of the first gate spacer 140.

Referring to FIG. 26, the second sacrificial film 165, the third sacrificial film 167, the second sub-dielectric film 124, and the first gate electrode 130 are formed.

The formation of the second sacrificial film 165, the third sacrificial film 167, the second sub-dielectric film 124, and the first gate electrode 130 is similar to that described above using FIGS. 19 to 21.

Referring to FIG. 27, the first contact insertion film 162 is formed.

For example, the second sacrificial film 165 and the third sacrificial film 167 may be removed. Subsequently, the first contact insertion film 162 may be formed on the upper surface of the substrate 100 (or the first etching blocking film 105) and the side surface of the first gate electrode 130.

The first contact insertion film 162 may at least partially surround the protruding end portion of the first active pattern AP1. For example, the first contact insertion film 162 may extend along the outer surface of the first gate dielectric film 120, the outer surface of the first gate spacer 140, and the protruding portion P2 of the first active pattern AP1.

Next, referring to FIG. 7, the first filling metal film 164 is formed on the first contact insertion film 162. Therefore, the semiconductor device described above using FIGS. 7 to 9 may be fabricated.

Figure 28:
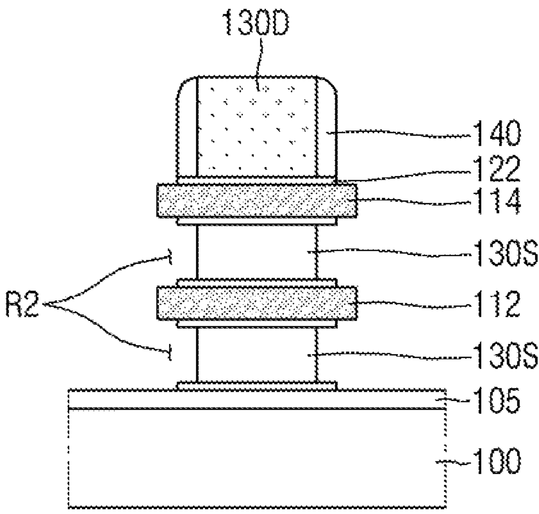
FIG. 28 to 32 are intermediate step process diagrams illustrating a method for fabricating a semiconductor device according to embodiments of the present disclosure.
Figure 28:
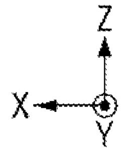

FIGS. 28 to 32 are intermediate step process diagrams illustrating a method for fabricating a semiconductor device according to embodiments of the present disclosure. To the extent that a detailed description of a particular element has been omitted, it may be assumed that this element is at least comparable to corresponding elements that have been described elsewhere within the present disclosure. For reference, FIG. 28 is an intermediate step diagram illustrating the process after FIG. 18.

Referring to FIG. 28, a selective growth process is performed on the sheet patterns 112 and 114.

Performance of the selective growth process is similar to that described above using FIG. 25.

Figure 29:
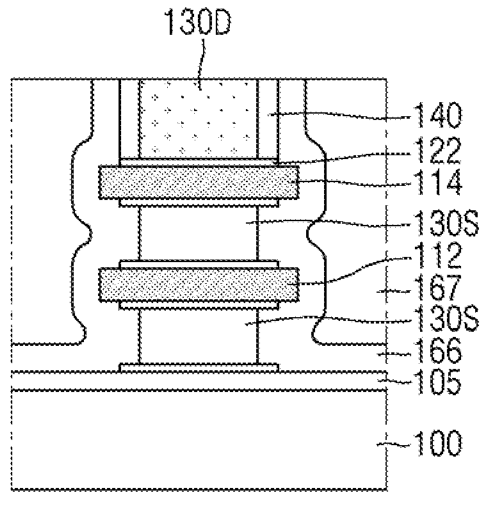
Figure 29:
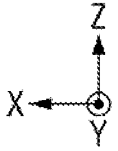

Referring to FIG. 29, a fourth sacrificial film 166 and a third sacrificial film 167 are formed on the substrate 100 (or the first etching blocking film 105).

The fourth sacrificial film 166 may extend along the outer surfaces of the sheet patterns 112 and 114, the outer surface of the first sub-dielectric film 122, and the outer surface of the first gate spacer 140. Further, the fourth sacrificial film 166 may fill the second recess R2 of FIG. 28. The fourth sacrificial film 166 may include an insulating material, for example, but is not necessarily limited to, silicon nitride, silicon oxynitride, silicon oxycarbide, silicon boron nitride, silicon boron carbonitride, silicon oxycarbonitride, and/or combinations thereof.

The third sacrificial film 167 may be stacked on the fourth sacrificial film 166. The third sacrificial film 167 may fill the region on the substrate 100 (or the first etching blocking film 105) that remains after the fourth sacrificial film 166 is formed.

Figure 30:
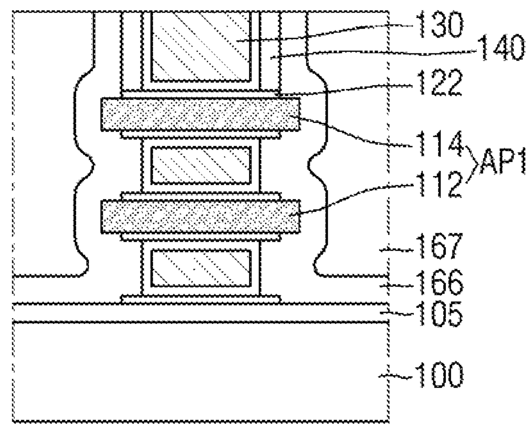
Figure 30:
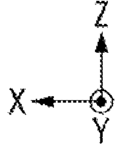

Referring to FIG. 30, the second sub-dielectric film 124 and the first gate electrode 130 are formed.

The formation of the second sub-dielectric film 124 and the first gate electrode 130 is similar to that described above using FIGS. 19 to 21.

Figure 31:
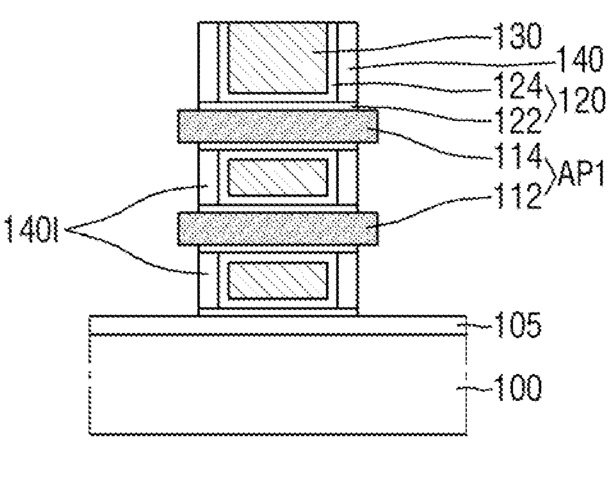
Figure 31:
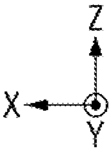

Referring to FIG. 31, a third recess process is performed on the third sacrificial film 167 and the fourth sacrificial film 166.

As the third recess process is performed, the third sacrificial film 167 and the fourth sacrificial film 166 may be selectively recessed. Accordingly, the first inner spacer 1401 that fills the second recess R2 of FIG. 28 may be formed.

Figure 32:
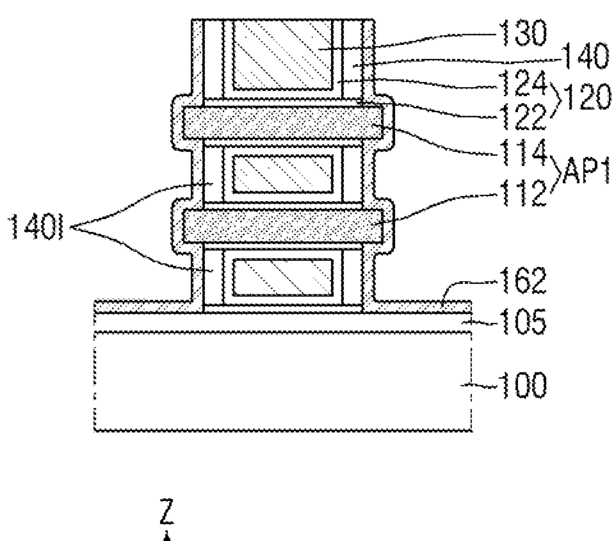

Referring to FIG. 32, the first contact insertion film 162 is formed.

The first contact insertion film 162 may at least partially surround the protruding end portion of the first active pattern AP1. For example, the first contact insertion film 162 may extend along the outer surface of the first inner spacer 1401, the outer surface of the first gate spacer 140, and the protruding portion P2 of the first active pattern AP1.

Next, referring to FIG. 10, the first filling metal film 164 is formed on the first contact insertion film 162. Therefore, the semiconductor device described above using FIGS. 10 to 12 may be fabricated.

Figure 33:
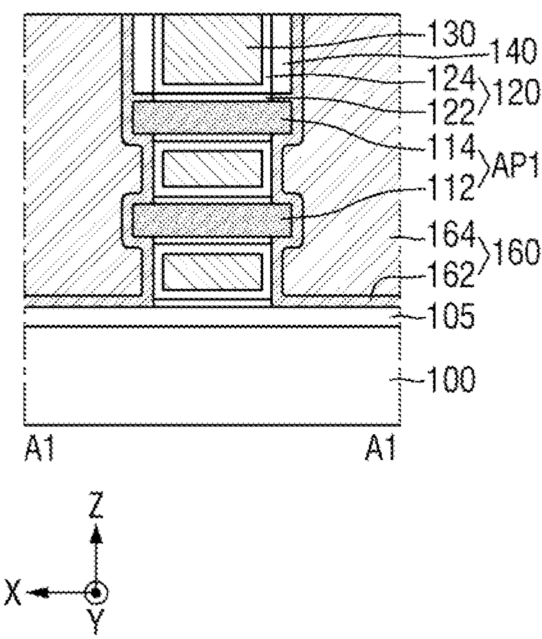
FIGS. 33 to 36 are intermediate process diagrams illustrating a method for fabricating a semiconductor device according to embodiments of the present disclosure.

FIGS. 33 to 36 are intermediate process diagrams illustrating a method for fabricating a semiconductor device according to embodiments of the present disclosure. To the extent that a detailed description of a particular element has been omitted, it may be assumed that this element is at least comparable to corresponding elements that have been described elsewhere within the present disclosure. For reference, FIG. 33 is an intermediate step diagram illustrating a step after FIG. 24.

Referring to FIG. 33, the first filling metal film 164 is formed on the first contact insertion film 162. Therefore, the first source/drain contact 160 including the first contact insertion film 162 and the first filling metal film 164 may be formed.

Figure 34:
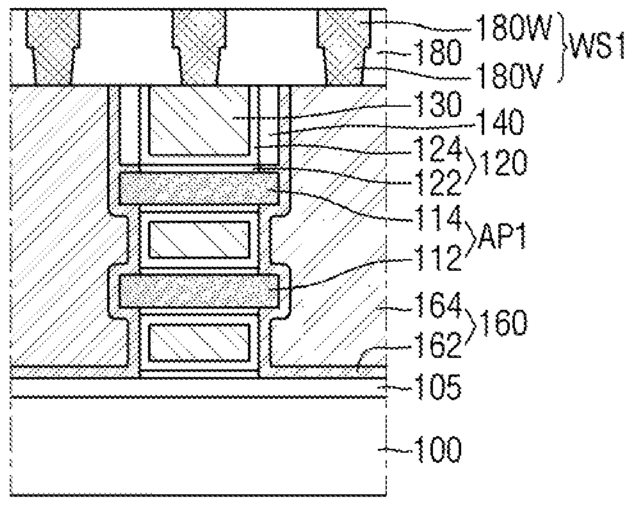
Figure 34:
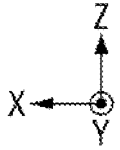

Referring to FIG. 34, the first wiring structure WS1 is formed on the first gate electrode 130 and the first source/drain contact 160.

The first wiring structure WS1 may be electrically connected to at least one of the first gate electrode 130 and the first source/drain contact 160. For example, the first wiring structure WS1 may include a first inter-wiring insulating film 180, and first wiring patterns 180W each extending in the second direction Y inside the first inter-wiring insulating film 180. The first wiring patterns 180W may be electrically connected to the first gate electrode 130 and/or the first source/drain contact 160 through the first via patterns 180V extending in the third direction Z inside the first inter-wiring insulating film 180.

Figure 35:
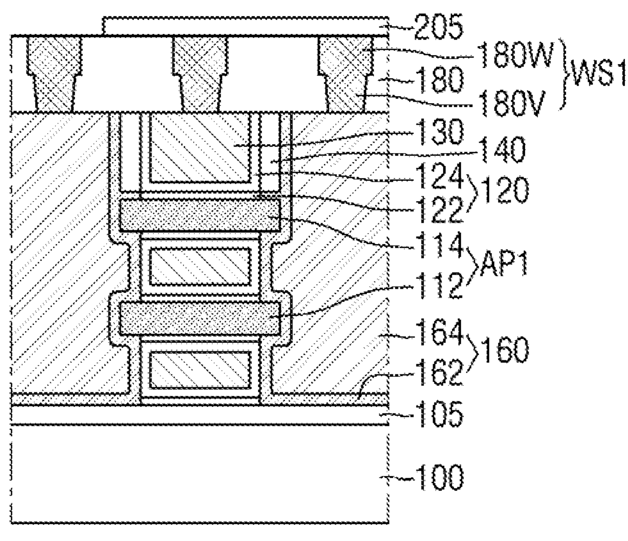
Figure 35:
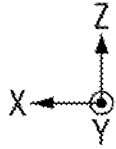

Referring to FIG. 35, the second etching blocking film 205 is formed on the first wiring structure WS1.

The second etching blocking film 205 may cover at least a part of the upper surface of the first wiring structure WS1. The second etching blocking film 205 may include an insulating material, for example, but is not necessarily limited to including, silicon nitride, silicon oxynitride, silicon oxycarbide, silicon boron nitride, silicon boron carbonitride, silicon oxycarbonitride, and/or combinations thereof.

In embodiments of the present disclosure, the second etching blocking film 205 may expose a part of the upper surface of the first wiring structure WS1. For example, the second etching blocking film 205 may be patterned to expose a part of the upper surface of the first wiring structure WS1.

Figure 36:
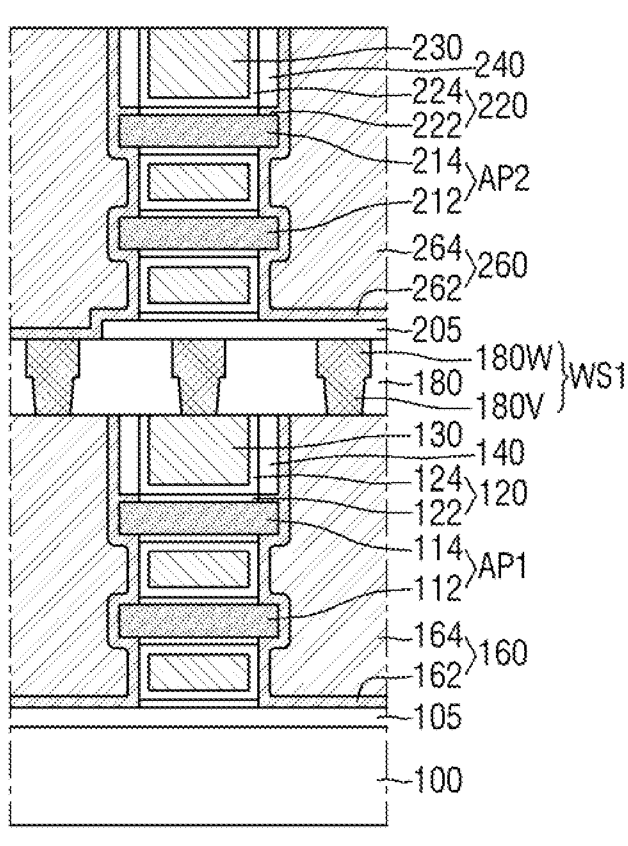
Figure 36:
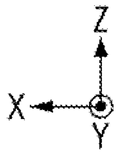

Referring to FIG. 36, a second active pattern AP2, a second gate dielectric film 220, a second gate electrode 230, a second gate spacer 240 and a second source/drain contact 260 are formed on the second etching blocking film 205.

The formation of the second active pattern AP2, the second gate dielectric film 220, the second gate electrode 230, the second gate spacer 240 and the second source/drain contact 260 is similar to that described above using FIGS. 16 to 27, except for stacking on the second etching blocking film 205.

Next, referring to FIG. 14, the second wiring structure WS2 is formed on the second gate electrode 230 and the second source/drain contact 260. The formation of the second wiring structure WS2 is similar to that described above using FIG. 37. Therefore, the semiconductor device described using FIGS. 13 and 14 may be fabricated.

In concluding the detailed description, those skilled in the art will appreciate that many variations and modifications may be made to the preferred embodiments without substantially departing from the principles of the present disclosure.

What is claimed is:

1. A semiconductor device, comprising:

a substrate;

a first active pattern spaced apart from the substrate and extending in a first direction, the first active pattern including a first two-dimensional semiconductor material;

a first gate electrode extending in a second direction intersecting the first direction on the substrate, and through which the first active pattern penetrates;

a gate spacer extending along a side surface of the first gate electrode, and through which the first active pattern penetrates; and a first source/drain contact including a first contact insertion film and a first filling metal film sequentially stacked on the side surface of the first gate electrode, the first source/drain contact connected to the first active pattern, wherein the first contact insertion film at least partially surrounds a lower surface, a side surface and an upper surface of an end portion of the first active pattern, wherein the first active pattern and the first contact insertion film form an ohmic contact, and wherein a portion of the first contact insertion film is interposed between the first active pattern and the gate spacer.

2. The semiconductor device of claim 1, wherein the first active pattern includes a channel region of an NFET, and wherein a value obtained by subtracting an electron affinity of the first two-dimensional semiconductor material from a work function of the first contact insertion film is 0.1 eV or less.

3. The semiconductor device of claim 2, wherein a work function of the first filling metal film is greater than a work function of the first two-dimensional semiconductor material.

4. The semiconductor device of claim 2, wherein the work function of the first contact insertion film is 3.4 eV or more.

5. The semiconductor device of claim 2, wherein the first active pattern includes a channel region of a PFET, and wherein a value obtained by subtracting a work function of the first contact insertion film from an ionization potential of the first two-dimensional semiconductor material is 0.1 eV or less.

6. The semiconductor device of claim 5, wherein a work function of the first filling metal film is smaller than a work function of the first two-dimensional semiconductor material.

7. The semiconductor device of claim 5, wherein the work function of the first contact insertion film is 6.9 eV or less.

8. The semiconductor device of claim 1, further comprising:

an etching blocking film interposed between the substrate and the first gate electrode, and between the substrate and the first source/drain contact.

9. The semiconductor device of claim 1, further comprising:

a wiring structure electrically connected to at least one of the first gate electrode and the first source/drain contact, on the first gate electrode and the first source/drain contact;

an etching blocking film covering at least a part of an upper surface of the wiring structure;

a second active pattern that is spaced apart from the etching blocking film and extends in the first direction, the second active pattern including a second two-dimensional semiconductor material;

a second gate electrode extending in the second direction on the etching blocking film, and through which the second active pattern penetrates; and a second source/drain contact including a second contact insertion film and a second filling metal film sequentially stacked on a side surface of the second gate electrode, and connected to the second active pattern, wherein the second contact insertion film at least partially surrounds a lower surface, a side surface and an upper surface of an end portion of the second active pattern, and wherein the second active pattern and the second contact insertion film form an ohmic contact.

10. The semiconductor device of claim 9, wherein the first two-dimensional semiconductor material and the second two-dimensional semiconductor material include transition metal dichalcogenides that are different from each other.

11. The semiconductor device of claim 9, wherein the first gate electrode and the second gate electrode include conductive materials that are different from each other.

12. The semiconductor device of claim 9, wherein the second source/drain contact penetrates the etching blocking film and is electrically connected to the wiring structure, and wherein the wiring structure electrically connects the first source/drain contact and the second source/drain contact.

13. A semiconductor device, comprising:

a substrate;

an active pattern spaced apart from the substrate and extending in a first direction, the active pattern including a two-dimensional semiconductor material;

a gate electrode extending in a second direction intersecting the first direction on the substrate, and through which the active pattern penetrates;

a gate dielectric film interposed between the active pattern and the gate electrode;

a gate spacer extending along a side surface of the gate electrode, and through which the active pattern penetrates; and a source/drain contact connected to the active pattern, on a side surface of the gate spacer, wherein the active pattern includes a channel portion that is at least partially surrounded by the gate dielectric film, and a protruding portion protruding from a side surface of the gate dielectric film, wherein the source/drain contact includes a contact insertion film extending along a profile of the protruding portion of the active pattern, and a filling metal film stacked on the contact insertion film, wherein the active pattern and the contact insertion film form an ohmic contact, and wherein a portion of the contact insertion film is interposed between the active pattern and the gate spacer.

14. The semiconductor device of claim 13, wherein the two-dimensional semiconductor material includes a transition metal dichalcogenide.

15. The semiconductor device of claim 14, wherein the active pattern includes a channel region of a NFET, and wherein the contact insertion film includes bismuth (Bi), antimony (Sb), tin (Sn), and/or indium (In).

16. The semiconductor device of claim 15, wherein a work function of the filling metal film is greater than a work function of the two-dimensional semiconductor material.

17. The semiconductor device of claim 16, wherein the active pattern includes a channel region of a PFET, and wherein the contact insertion film includes ruthenium (Ru).

18. The semiconductor device of claim 17, wherein the work function of the filling metal film is smaller than the work function of the two-dimensional semiconductor material.

* * * * *